United States Patent
Ueda

(10) Patent No.: US 7,859,509 B2
(45) Date of Patent: Dec. 28, 2010

(54) SEMICONDUCTOR INTEGRATED CIRCUIT DEVICE USED IN DATA LINE DRIVER OF PLANE TYPE DISPLAY APPARATUS

(75) Inventor: Toshiaki Ueda, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 882 days.

(21) Appl. No.: 11/729,773

(22) Filed: Mar. 30, 2007

(65) Prior Publication Data

US 2007/0242027 A1    Oct. 18, 2007

(30) Foreign Application Priority Data

Mar. 31, 2006   (JP)   .............................. 2006-100646

(51) Int. Cl.
*G09G 3/36*   (2006.01)
(52) U.S. Cl. ........................................ 345/100; 377/64
(58) Field of Classification Search ........... 345/98–100; 377/64–81
See application file for complete search history.

(56) References Cited

U.S. PATENT DOCUMENTS

| 4,396,829 | A | * | 8/1983 | Sugihara et al. | ............... 377/54 |
|---|---|---|---|---|---|
| 4,866,742 | A | * | 9/1989 | Fujiyama et al. | ............... 377/70 |
| 6,456,271 | B1 | * | 9/2002 | Tamai et al. | ................. 345/100 |
| 6,476,789 | B1 | * | 11/2002 | Sakaguchi et al. | .......... 345/100 |
| 6,603,466 | B1 | * | 8/2003 | Sakaguchi et al. | .......... 345/204 |
| 6,839,046 | B1 | * | 1/2005 | Orisaka et al. | ................. 345/98 |
| 2003/0184511 | A1 | * | 10/2003 | Sekido et al. | ................. 345/99 |
| 2005/0017942 | A1 | * | 1/2005 | Tsujino et al. | .............. 345/102 |
| 2005/0184979 | A1 | * | 8/2005 | Sakaguchi | ................... 345/204 |

FOREIGN PATENT DOCUMENTS

| JP | 2000-250495 | 9/2000 |
|---|---|---|
| JP | 2001-42813 | 2/2001 |
| JP | 2002-14657 | 1/2002 |

* cited by examiner

*Primary Examiner*—Alexander Eisen
*Assistant Examiner*—Patrick Marinelli
(74) *Attorney, Agent, or Firm*—McGinn Intellectual Property Law Group, PLLC

(57) ABSTRACT

In a semiconductor integrated circuit device, a shift register includes a plurality of cascaded flip-flops adapted to generate shift pulse signals in response to a start signal. A logic circuit receives a pulse signal at its input end and supplies the pulse signal from its plurality of output ends to the flip-flops. The pulse signal at each of the plurality of output ends is allowed and prohibited by a corresponding one of the shift pulse signals.

9 Claims, 13 Drawing Sheets

SEMICONDUCTOR INTEGRATED CIRCUIT DEVICE USED IN DATA LINE DRIVER OF PLANE TYPE DISPLAY APPARATUS

BACKGROUND OF THE INVENTION

1. Field of the Invention

The present invention relates to a semiconductor integrated circuit device which can be used in a data line driver of a plane type display apparatus such as a liquid crystal display (LCD) apparatus.

2. Description of the Related Art

Generally, in a plane type display apparatus including a panel having data lines (or signal lines), scan lines (or gate lines) and cells each located at one intersection between the data lines and the scan lines, a plurality of data line drivers are provided along a horizontal direction to drive the data lines and a plurality of scan line drivers are provided along a vertical direction to drive the scan lines. Each of the data line drivers is constructed by a horizontal shift register and a data register in order to latch 18-bit pixel signals each formed by red data (R) (6 bits), green data (G) (6 bits), and blue data (B) (6 bits). For example, the horizontal shift register is constructed by 128-cascaded flip-flops for shifting a horizontal start signal in synchronization with a horizontal clock signal to sequentially generate 128 shift pulse signals for latching 128 pixel signals in synchronization with the 128 shift pulse signals. This will be explained later in detail.

In the above-described data line driver, as the quality of the panel has become highly-defined and the size of the panel has been increased, a clock signal line for carrying the horizontal clock signal and pixel lines for carrying the pixel signal have been lengthened. Therefore, buffers for generating the horizontal clock signal and the pixel signal need to have large driving ability. In this case, since the speed of the horizontal clock signal and the pixel signal have also been increased, the average values and peak values of the circuit currents of the buffers have been increased, so that the power consumption has been increased and the electromagnetic interference (EMI) noise has been increased.

In a first prior art semiconductor integrated circuit device including a plurality of shift registers and a plurality of data registers (see: JP-2001-42813A), clock signal lines for the shift registers are divided into two internal clock signal line groups which are time-divisionally controlled by a clock control circuit including counters, and pixel lines for the data registers are divided into two internal pixel line groups which are time-divisionally controlled by a data control circuit including AND circuits. Thus, the capacitance of the clock signal lines and the capacitance of the pixel lines are substantially decreased to decrease the power consumption.

In a second prior art semiconductor integrated circuit device including a shift register and a data register (sampling register) (see: JP-2002-014657A), clock signal lines for the shift register and pixel lines for the data register are divided into two internal clock signal line groups and two internal pixel line groups, respectively, which are time-divisionally controlled by a switch control circuit. Thus, the capacitance of the clock signal lines and the capacitance of the pixel lines are substantially decreased to decrease the power consumption.

In a third prior art semiconductor integrated circuit device including a shift register and a data register (see; JP-2000-250495A), a pixel line for the data register is divided into two internal pixel lines which are time-divisionally controlled by a control signal generating circuit in synchronization with the operation of the shift register which are also divided into two portions. Thus, the capacitance of the pixel lines is substantially decreased to decrease the power consumption.

SUMMARY OF THE INVENTION

In the above-described first prior art semiconductor integrated circuit device, however, when the number of internal clock signal line groups and the number of internal pixel line groups are increased to further substantially decrease the capacitance of the clock signal lines and the capacitance of the pixel lines, the number of counters and the number of AND circuits are also increased. In this case, since a clock signal needs to be supplied to all of the counters and a pixel signal needs to be supplied to all of the AND circuits, a clock signal line carrying the clock signal for the counters and a pixel line carrying the pixel signal for the AND circuits are substantially lengthened, which would dilute the decreasing effect of the capacitance of the clock signal lines for the shift registers and the decreasing effect of the capacitance of the pixel lines for the data registers.

Also, in the above-described second and third semiconductor integrated circuit devices, however, when the number of internal pixel line groups is increased to further substantially decrease the capacitance of the pixel lines, the number of switches within the switch control circuit or within the control signal generating circuit is increased, so that the switch control circuit or the control signal generating circuit would be more complex and larger in size.

According to the present invention, in a semiconductor integrated circuit device, a shift register includes a plurality of cascaded flip-flops adapted to generate shift pulse signals in response to a start signal. A logic circuit receives a pulse signal at its input end and supplies the pulse signal from its plurality of output ends to the flip-flops. The pulse signal at each of the plurality of output ends is allowed and prohibited by a corresponding one of the shift pulse signals.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art LCD apparatus will be explained with reference to FIGS. 1 and 2.

Figure 1:
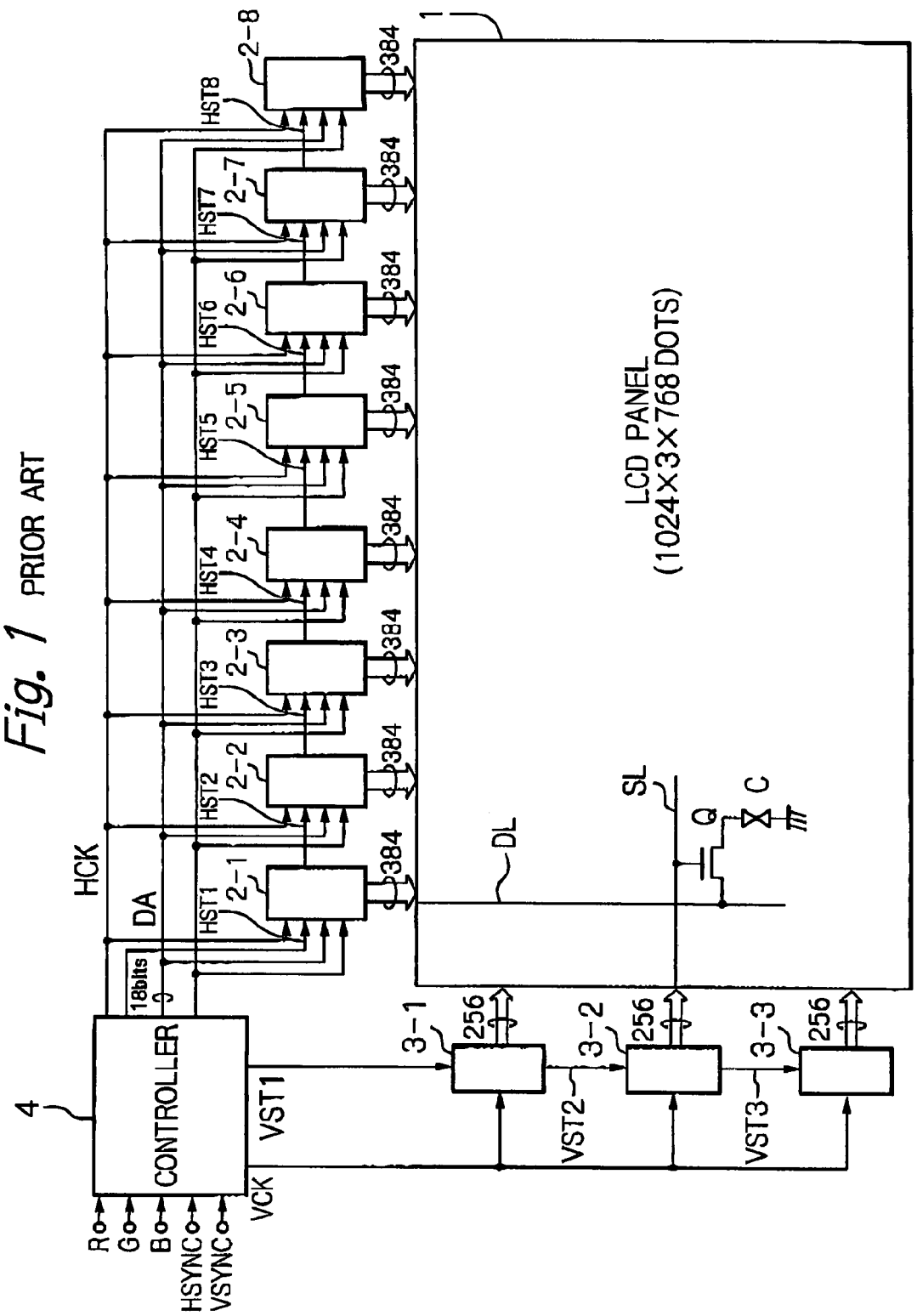
FIG. 1 is a block circuit diagram illustrating a prior art LCD apparatus.

In FIG. 1, which illustrates a prior art LCD apparatus, reference numeral 1 designates an LCD panel having 1024× 768 pixels each formed by three color dots, i.e., R (red), G (green) and B (blue). Therefore, the LCD panel 1 includes 2359296 dots located at 3072 (=1024×3) data lines (or signal lines) DL and 768 scan lines (or gate lines) SL. One dot is formed by one thin film transistor Q and one liquid crystal cell C. For example, if one dot is represented by 64 gradation voltages, one pixel is represented by 262144 (=64×64×64) colors. This LCD panel is called an extended graphics array (XGA).

In order to drive the 3072 data lines DL, eight data line drivers 2-1, 2-2, . . . , 2-8 each for driving 384 data lines are provided along a horizontal edge of the LCD panel 1. On the other hand, in order to drive the 768 scan lines SL, three scan line drivers 3-1, 3-2 and 3-3 each for driving 256 scan lines are provided along a vertical edge of the LCD panel 1.

A controller 4 receives color signals R, G and B, a horizontal synchronization signal HSYNC and a vertical synchronization signal VSYNC from a personal computer or the line using a low voltage differential signaling (LVDS) interface, and generates a horizontal start signal HST1, a horizontal clock signal HCK, a pixel signal DA, a strobe signal STB for the data line drivers 2-1, 2-2, . . . , 2-8, a vertical start signal VST1 and a vertical clock signal VCK for the scan line drivers 3-1, 3-2 and 3-3.

In FIG. 1, the data line drivers 2-1, 2-2, . . . , 2-8 are arranged by a cascade connection method to pass the horizontal start signal HST1 therethrough in synchronization with the horizontal clock signal HCK. In this case, if a horizontal start signal output from the data line driver 2-1 is denoted by HST2, the horizontal start signal HST2 is supplied to the data line driver 2-2. Also, if a horizontal start signal output from the data line driver 2-2 is denoted by HST3, the horizontal start signal HST3 is supplied to the data line driver 2-3. Further, if a horizontal start signal output from the data line driver 2-7 is denoted by HST8, the horizontal start signal HST8 is supplied to the data line driver 2-8.

Also, in FIG. 1, the scan line drivers 3-1, 3-2 and 3-3 are arranged by a cascade connection method to pass the vertical start signal VST1 therethrough in synchronization with the vertical clock signal VCK. In this case, if a vertical start signal output from the scan line driver 3-1 is denoted by VST2, the vertical start signal VST2 is supplied to the scan line driver 3-2. Also, if a vertical start signal output from the scan line driver 3-2 is denoted by VST3, the vertical start signal VST3 is supplied to the scan line driver 3-3.

The operation of the LCD apparatus of FIG. 1 will now be briefly explained. A vertical start signal is shifted within the shift registers of each of the scan line drivers 3-1, 3-2 and 3-3, so that one scan line is selected to turn ON all the thin film transistors Q connected thereto. On the other hand, a horizontal start signal such as HST1 is shifted within the shift registers of each of the data line drivers 2-1, 2-2, . . . , 2-8, so that video data of one scan line is latched. Then, the gradation voltages corresponding to the video data are applied by the strobe signal STB via the thin film transistors at the scan line to the liquid crystal cells C thereof. After that, the gradation voltages applied to the liquid crystal cells C are maintained until the next selecting operation is performed thereon.

Figure 2:
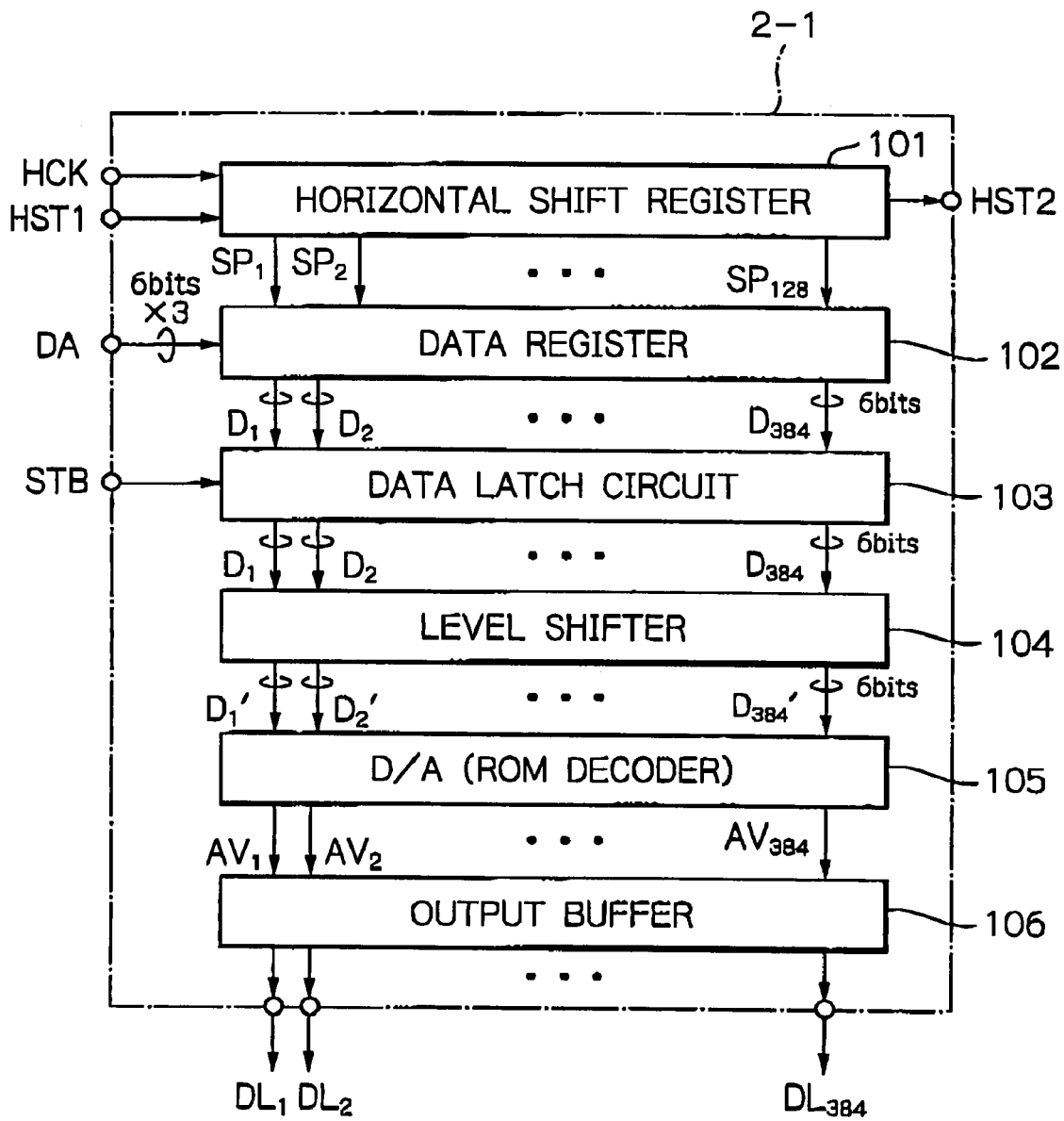
FIG. 2 is a detailed block circuit diagram of the data line driver of FIG. 1.

In FIG. 2, which is a detailed block circuit diagram of the data line driver 2-1 of FIG. 1, the data line driver 2-1 is constructed by a horizontal shift register 101, a data register 102, a data latch circuit 103, a level shifter 104, a digital/analog (D/A) converter 105, and an output buffer 106 formed by voltage followers connected to data lines $DL_1, DL_2, \ldots, DL_{384}$.

The horizontal shift register 101 shifts the horizontal start signal HST1 in synchronization with the horizontal clock signal HCK, to sequentially generate shift pulse signals $SP_1, SP_2, \ldots, SP_{128}$. The horizontal shift register 101 also generates the horizontal start signal HST2 for the next stage data line driver 2-2.

The data register 102 latches the pixel signal (data signal) DA (18 bits) formed by red data (R) (6 bits), green data (G) (6 bits) and blue data (B) (6 bits) in synchronization with the shift pulse signals $SP_1, SP_2, \ldots, SP_{128}$, to generate video signals $D_1, D_2, \ldots, D_{384}$, respectively. The video signals $D_1, D_2, \ldots, D_{384}$ are supplied to the data latch circuit 103.

The data latch circuit 103 latches the video signals $D_1, D_2, \ldots, D_{384}$ of the data register 102 in synchronization with the strobe signal STB.

The level shifter 104 shifts the video signals $D_1, D_2, \ldots, D_{384}$ by a level shift amount $\Delta V$ applied to the liquid crystal of the LCD panel 1 to generate video signals $D_1', D_2', \ldots, D_{384}'$. That is, the level shift amount $\Delta V$ is a preset voltage to initiate the change of the transmittance of the liquid crystal.

The D/A converter 105 performs D/A conversions upon the shifted video signals $D_1', D_2', \ldots, D_{384}'$, using the multi-gradation voltages such as 64 gradation voltages to generate analog voltages $AV_1, AV_2, \ldots, AV_{354}$ which are supplied via the output buffer 106 to the data lines $DL_1, DL_2, \ldots, DL_{384}$, respectively.

In the data line driver 201, as the quality of the panel 1 has become highly-defined and the size of the panel 1 has been increased, a clock signal line for carrying the horizontal clock signal HCK and pixel lines for carrying the pixel signal DA have been lengthened. Therefore, buffers of the controller 4 for generating the horizontal clock signal HCK and the pixel signal DA need to have large driving ability. In this case, since the speed of the horizontal clock signal HCK and the pixel signal DA have also been increased, the average values and peak values of the circuit currents of the buffers have been increased, so that the power consumption has been increased and the electromagnetic interference (EMI) noise has been increased.

Figure 3:
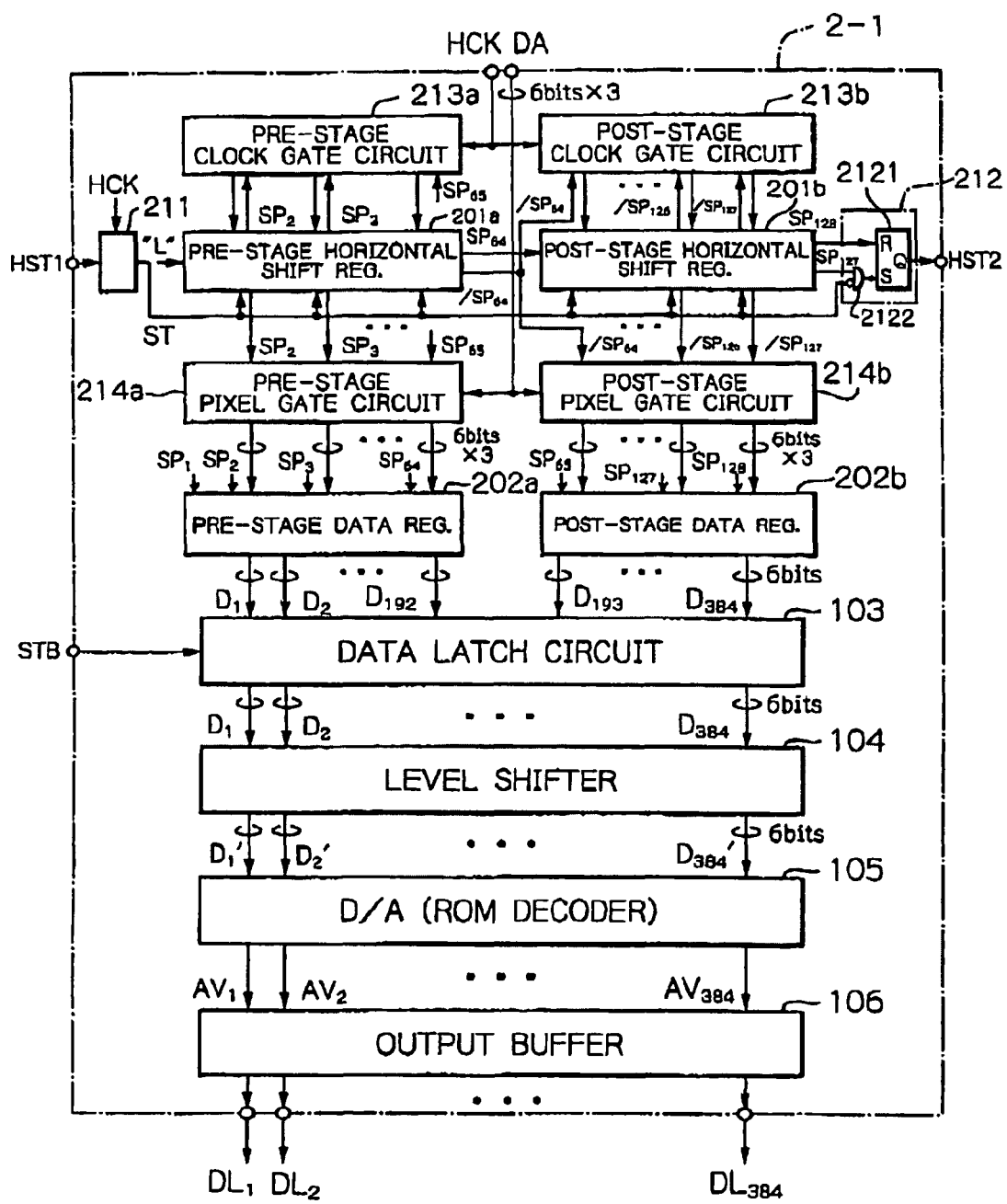
FIG. 3 is a block circuit diagram illustrating a first embodiment of the semiconductor integrated circuit device according to the present invention applied to a data line driver.

In FIG. 3, which illustrates a first embodiment of the semiconductor integrated circuit device according to the present invention applied to one of the data line drivers such as 2-1 of FIG. 1, the horizontal shift register 101 of FIG. 2 is replaced by a pre-stage horizontal shift register 201a for receiving a low level signal "L" such as the ground voltage to generate shift pulse signals $SP_1, SP_2, SP_3, \ldots, SP_{64}$ and an inverted shift pulse signal $/SP_{64}$, and a post-stage horizontal shift register 201b for receiving the shift pulse signal $SP_{64}$ from the pre-stage horizontal shift register 201a to generate shift pulse signals $SP_{65}, \ldots, SP_{127}, SP_{128}$ and inverted shift pulse signals $/SP_{65}, \ldots, /SP_{126}, /SP_{127}$.

Also, the data register 102 of FIG. 2 is replaced by a pre-stage data register 202a for latching the pixel signal DA in synchronization with the shift pulse signals $SP_1, SP_2, \ldots, SP_{64}$, and a post-stage data register 202b for latching the pixel signal DA in synchronization with the shift pulse signals $SP_{65}, \ldots, SP_{127}, SP_{128}$.

A set signal generating circuit 211 is provided to receive the horizontal start signal HST1 and the horizontal clock signal HCK to generate a set signal ST which is supplied to the pre-stage horizontal shift register 201a and the post-stage horizontal shift register 201b.

Figure 4A:
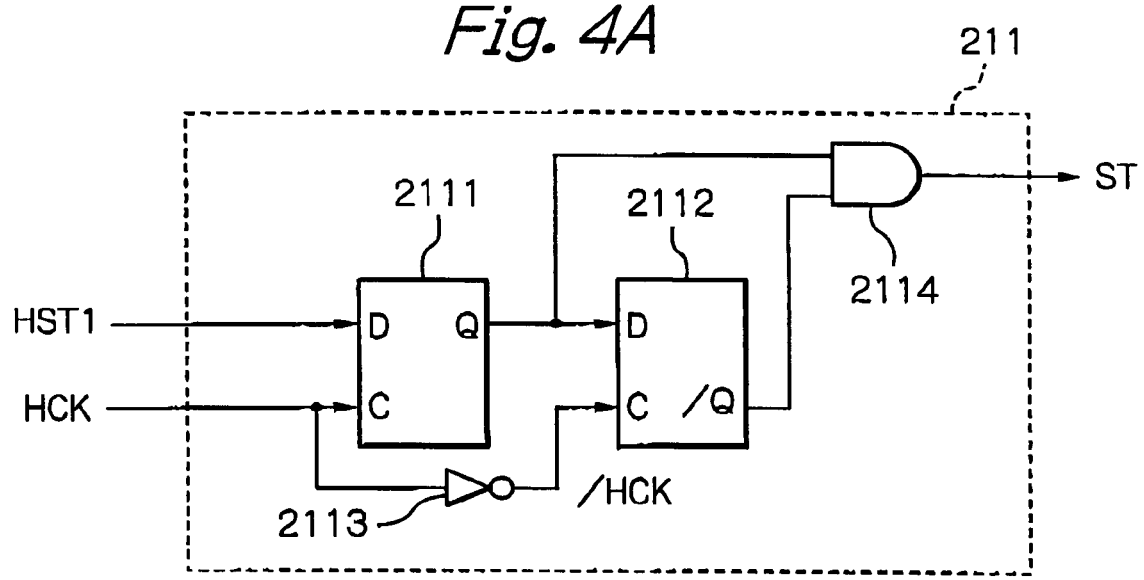
FIG. 4A is a detailed circuit diagram of the set signal generating circuit of FIG. 3.

As illustrated in FIG. 4A, which is a detailed block circuit diagram of the set signal generating circuit 211 of FIG. 3, the set signal generating circuit 211 is constructed by two D flip-flops 2111 and 2112, an inverter 2113 and an AND circuit 2114.

Figure 4B:
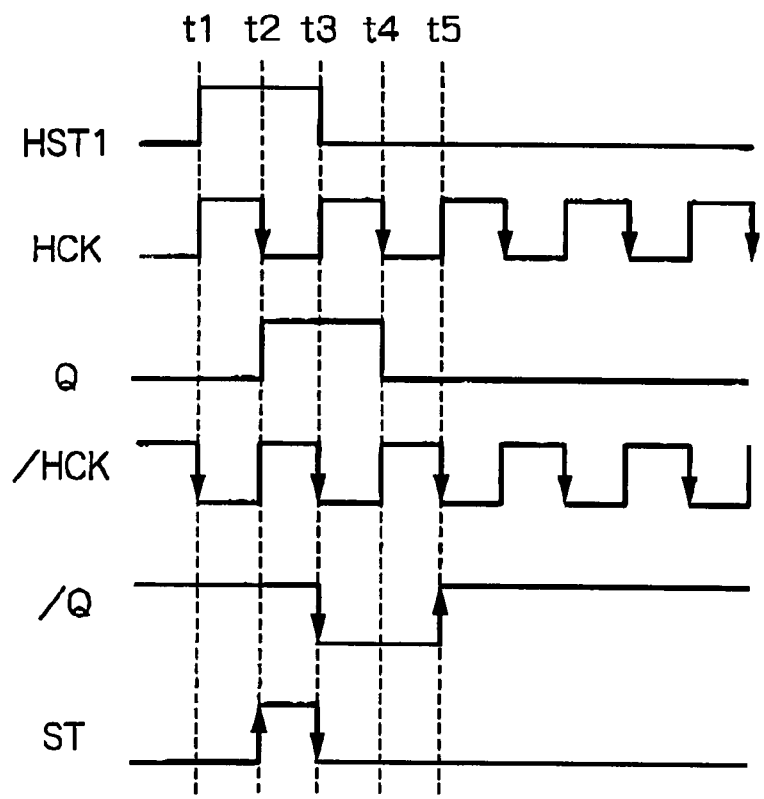
FIG. 4B is a timing diagram for explaining the operation of the set signal generating circuit of FIG. 4A.

The operation of the set signal generating circuit 211 of FIG. 4A is explained next with reference to FIG. 4B. That is, in the D flip-flop 2111, the horizontal start signal HST1 which rises at time t1 and falls at time t3 is latched by a falling edge of the horizontal clock signal HCK. As a result, the output Q of the D flip-flop 2111 rises at time t2 and falls at time t4. Then, in the D flip-flop 2112, the output Q of the D flip-flop 2111 is latched by a falling edge of the inverted horizontal clock signal /HCK. As a result, the output /Q of the D flip-flop 2112 falls at time t3 and rises at time t4. Thus, the AND circuit 2114 performs an AND operation upon the output Q of the D flip-flop 2111 and the output /Q of the D flip-flop 2112 to generate the set signal ST which rises at time t2 and falls at time t3.

Returning to FIG. 3, a start signal generating circuit 212 is provided to receive the shift pulse signals $SP_{127}$ and $SP_{128}$ from the post-stage horizontal shift register 201b as well as the set signal ST from the set signal generating circuit 211, to generate the horizontal start signal HST2 for the next data line driver 2-2 (see: FIG. 1). That is, the start pulse generating circuit 212 is constructed by an RS flip-flop 2121 which is set by a falling edge of the shift pulse signal $SP_{127}$ through a gate circuit 2122 when the set signal ST is low, and is reset by a falling edge of the shift pulse signal $SP_{128}$.

A pre-stage clock gate circuit (logic circuit) 213a is provided to receive the horizontal clock signal HCK at an input end and supply it from a plurality of output ends to the pre-stage horizontal shift register 201a in synchronization with the shift pulse signals $SP_2, SP_3, \ldots, SP_{65}$. In this case, the horizontal clock signal HCK is switched ON and OFF (or allowed and prohibited) at the output ends by the shift pulse signals $SP_2, SP_3, \ldots, SP_{65}$, respectively.

Similarly, a post-stage clock gate circuit (logic circuit) 213b is provided to receive the horizontal clock signal HCK at an input end and supply it from a plurality of output ends to the post-stage horizontal shift register 201b in synchronization with the inverted shift pulse signals $/SP_{64}, \ldots, /SP_{126}, /SP_{127}$. In this case, the horizontal clock signal HCK is switched ON and OFF (or allowed and prohibited) at the output ends by the inverted shift pulse signals $/SP_{64}, \ldots, /SP_{126}, /SP_{127}$, respectively.

A pre-stage pixel gate circuit (logic circuit) 214a is provided to receive the pixel signal DA at an input end and supply it from a plurality of output ends to the pre-stage data register 202a in synchronization with the shift pulse signals $SP_2, SP_3, \ldots, SP_{65}$. In this case, the pixel signal DA is switched ON and OFF (or allowed and prohibited) at the output ends by the shift pulse signals $SP_2, SP_3, \ldots, SP_{65}$, respectively.

Similarly, a post-stage pixel gate circuit (logic circuit) 214b is provided to receive the pixel signal DA at an input end and supply it from a plurality of output ends to the post-stage horizontal data register 202b in synchronization with the inverted shift pulse signals $/SP_{64}, \ldots, /SP_{126}, /SP_{127}$. In this case, the pixel signal DA is switched ON and OFF (or allowed and prohibited) at the output ends by the inverted shift pulse signals $/SP_{64}, \ldots, /SP_{126}, /SP_{127}$, respectively.

The pre-stage horizontal shift register 201a, the post-stage horizontal shift register 201b, the pre-stage data register 202a, the post-stage data register 202b, the pre-stage clock gate circuit 213a, the post-stage clock gate circuit 213b, the pre-stage pixel gate circuit 214a and the post-stage pixel gate circuit 214b are explained next in detail with reference to FIG. 5.

The pre-stage horizontal shift register 201a is constructed by set-type D flip-flops $F_1, F_2, \ldots, F_{64}$, and the post-stage horizontal shift register 201b is constructed by set-type D flip-flops $F_{65}, \ldots, F_{127}, F_{128}$. The set-type D flip-flops $F_1, F_2, \ldots, F_{128}$ are cascaded. That is, the output of the set-type D flip-flops $F_i$ (i=1, 2, . . . , 127) is connected to the data input D of the set-type D flip-flop $F_{i+1}$. Supplied to the data input D of the set-type D flip-flop $F_1$ is a low level signal "L", not the horizontal start signal HST1. Also, the horizontal clock signal HCK is supplied via the clock gate circuits 213a and 213b to the clock inputs C of the set-type D flip-flops $F_1, F_2, \ldots, F_{128}$. The outputs Q of the set-type D flip-flops $F_1, F_2, \ldots, F_{128}$ generate the shift pulse signals $SP_1, SP_2, \ldots, SP_{128}$, respectively, and the outputs /Q of the set-type D flip-flops $F_{64}, \ldots, F_{126}, F_{127}$ generate the inverted shift pulse signals $/SP_{64}, \ldots, /SP_{126}, /SP_{127}$, respectively. Also, the set signal ST is supplied to the set inputs S of the set-type D flip-flops $F_1, F_2, \ldots, F_{128}$. As a result, when the set signal ST rises, the set-type D flip-flops $F_1, F_2, \ldots, F_{128}$ are set, so that their outputs Q show a high level and their outputs /Q show a low level. After the set-type D flip-flops $F_1, F_2, \ldots, F_{128}$ are set by the set signal ST, the set-type D flip-flops $F_1, F_2, \ldots, F_{128}$ shift the low level signal "L" in synchronization with the horizontal clock signal HCK.

The pre-stage data register 202a is constructed by 18-bit data registers $R_1, R_2, \ldots, R_{64}$, and the post-stage data register 202b is constructed by 18-bit data registers $R_{65}, \ldots, R_{127}, R_{128}$. The 18-bit data registers $R_1, R_2, \ldots, R_{128}$ latch the 18-bit pixel signal DA in synchronization with falling edges of the shift pulse signals $SP_1, SP_2, \ldots, SP_{128}$, respectively.

The pre-stage clock gate circuit 213a is constructed by cascaded AND circuits $GA_1, GA_2, \ldots, GA_{64}$. That is, connected to an input of the AND circuit $GA_i$ (i=1, 2, . . . , 63) is the output of the AND circuit $GA_{i+1}$. Also, an input of the AND circuit $GA_{64}$ receives the horizontal clock signal HCK. Supplied to the other input of the AND circuit $GA_i$ (i=1, 2, . . . , 64) is the shift pulse signal $SP_{i+1}$. The outputs of the AND circuits $GA_1, GA_2, \ldots, GA_{64}$ are connected via clock signal lines $CL_1, CL_2, \ldots, CL_{64}$ to the clock inputs C of the set-type D flip-flops $F_1, F_2, \ldots, F_{64}$, respectively. As a result, the clock signal lines $CL_1, CL_2, \ldots, CL_{64}$ are sequentially grounded in synchronization with the falling edges of the shift pulse signals $SP_2, SP_3, \ldots, SP_{65}$, respectively. Therefore, first, the horizontal clock signal HCK is supplied via the clock signal lines $CL_1, CL_2, \ldots, CL_{64}$ to all the set-type D flip-flops $F_1, F_2, \ldots, F_{64}$. Then, the supplying of the horizontal clock signal HCK via the clock signal line $CL_1$ to the set-type D flip-flop $F_1$ is prohibited, so that the horizontal clock signal HCK is supplied via the clock signal lines $CL_2, CL_3, \ldots$, $CL_{64}$ to only the set-type D flip-flops $F_2, F_3, \ldots, F_{64}$. Finally, the supplying of the horizontal clock signal HCK via the clock signal lines $CL_1, CL_2, \ldots, CL_{64}$ to the set-type D flip-flops $F_1, F_2, \ldots, F_{64}$ is prohibited, so that the horizontal clock signal HCK is not supplied to any of the set-type D flip-flops $F_1, F_2, \ldots, F_{64}$.

On the other hand, the post-stage clock gate circuit 213b is constructed by cascaded AND circuits $GA_{65}, \ldots, GA_{127}, GA_{128}$. That is, an input of the AND circuit $GA_{65}$ receives the horizontal clock signal HCK. Also, connected to an input of the AND circuit $GA_i$ (i=66, ..., 127, 128) is the output of the AND circuit $GA_{i-1}$. Supplied to the other input of the AND circuit $GA_i$ (i=65, ..., 127, 128) is the inverted shift pulse signal $/SP_{i-1}$. The outputs of the AND circuits $GA_{65}, \ldots, GA_{127}, GA_{128}$ are connected via clock signal lines $CL_{65}, \ldots, CL_{127}, CL_{128}$ to the clock inputs C of the set-type D flip-flops $F_{65}, \ldots, F_{127}, F_{128}$, respectively. As a result, the clock signal lines $CL_{65}, \ldots, CL_{127}, CL_{128}$ are sequentially activated in synchronization with the rising edges of the inverted shift pulse signals $/SP_{64}, \ldots, /SP_{126}, /SP_{127}$, respectively. Therefore, first, the supplying of the horizontal clock signal HCK via the clock signal lines $CL_{65}, \ldots, CL_{127}, CL_{128}$ to all the set-type D flip-flops $F_{65}, \ldots, F_{127}, F_{128}$ is prohibited. Then, the supplying of the horizontal clock signal HCK via the clock signal line $CL_{66}$ to the set-type D flip-flop $F_{65}$ is allowed, so that the horizontal clock signal HCK is supplied via the clock signal line $CL_{65}$ to only the set-type D flip-flop $F_{65}$. Finally, the supplying of the horizontal clock signal HCK via the clock signal lines $CL_{65}, \ldots, CL_{127}, CL_{128}$ to the set-type D flip-flops $F_{65}, \ldots, F_{127}, F_{128}$ is allowed, so that the horizontal clock signal HCK is supplied via the clock signal lines $CL_{86}, \ldots, CL_{127}, CL_{128}$ to all of the set-type D flip-flops $F_{85}, \ldots F_{127}, F_{128}$.

The pre-stage pixel gate circuit 214a is constructed by cascaded AND circuits $GB_1, GB_2, \ldots, GB_{64}$. That is, connected to an input of the AND circuit $GB_i$ (i=1, 2, ..., 63) is the output of the AND circuit $GB_{i+1}$. Also, an input of the AND circuit $GB_{64}$ receives the pixel signal DA. Supplied to the other input of the AND circuit $GB_i$ (i=1, 2, ..., 64) is the shift pulse signal $SP_{i+1}$. The outputs of the AND circuits $GB_1, GB_2, \ldots, GB_{64}$ are connected via 18-bit pixel lines $PL_1, PL_2, \ldots, PL_{64}$ to the data inputs D of the 18-bit data registers $R_1, R_2, \ldots, R_{64}$, respectively. As a result, the pixel lines $PL_1, PL_2, \ldots, PL_{64}$ are sequentially grounded in synchronization with the falling edges of the shift pulse signals $SP_2, SP_3, \ldots, SP_{65}$, respectively. Therefore, first, the 18-bit pixel signal DA is supplied via the pixel lines $PL_1, PL_2, \ldots, PL_{64}$ to all the 18-bit data registers $R_1, R_2, \ldots, R_{64}$. Then, the supplying of the 18-bit pixel signal DA via the pixel line $PL_1$ to the 18-bit data register $R_1$ is prohibited, so that the 18-bit pixel signal DA is supplied via the pixel lines $PL_2, PL_3, \ldots, PL_{64}$ to only the 18-bit data registers $R_2, R_3, \ldots, R_{64}$. Finally, the supplying of the 18-bit pixel signal DA via the pixel lines $PL_1, PL_2, \ldots, PL_{64}$ to the 18-bit data registers $R_1, R_2, \ldots, R_{64}$ is prohibited, so that the 18-bit pixel signal DA is not supplied to any of the 18-bit data registers $R_1, R_2, \ldots, R_{64}$.

On the other hand, the post-stage pixel gate circuit 214b is constructed by cascaded AND circuits $GB_{65}, \ldots, GB_{127}, GB_{128}$. That is, an input of the AND circuit $GB_{65}$ receives the pixel signal DA. Also, connected to an input of the AND circuit $GB_i$ (i=66, ..., 127, 128) is the output of the AND circuit $GB_{i-1}$. Supplied to the other input of the AND circuit $GB_i$ (i=65, ..., 127, 128) is the inverted shift pulse signal $/SP_{i-1}$. The outputs of the AND circuits $GB_{65}, \ldots, GB_{127}, GB_{128}$ are connected via 18-bit data pixel lines $PL_{65}, \ldots, PL_{127}, PL_{128}$ to the data inputs D of the 18-bit data registers $R_{65}, \ldots, R_{127}, R_{128}$, respectively. As a result, the pixel lines $PL_{65}, \ldots, PL_{127}, PL_{128}$ are sequentially activated in synchronization with the rising edges of the inverted shift pulse signals $/SP_{64}, \ldots, /SP_{128}, /SP_{127}$, respectively. Therefore, first, the supplying of the 18-bit pixel signal DA via the pixel lines $PL_{66}, \ldots, PL_{127}, PL_{128}$ to all the 18-bit data registers $R_{65}, \ldots, R_{127}, R_{128}$ is prohibited. Then, the supplying of the 18-bit pixel signal DA via the pixel line $PL_{65}$ to the 18-bit data register $R_{66}$ is allowed, so that the 18-bit pixel signal DA is supplied via the pixel line $PL_{65}$ to only the 18-bit data registers $R_{65}$. Finally, the supplying of the 18-bit pixel signal DA via the pixel lines $PL_{65}, \ldots, PL_{127}, PL_{128}$ to the 18-bit data registers $R_{65}, \ldots, R_{127}, R_{128}$ is allowed, so that the 18-bit pixel signal DA is supplied via the pixel lines $PL_{65}, \ldots, PL_{127}, PL_{128}$ to all of the 18-bit data registers $R_{65}, \ldots, R_{127}, R_{128}$.

Note that each of the 18-bit data registers $R_1, R_2, \ldots, R_{128}$ generate 6-bit video signals such as a 6-bit red signal such as $D_1$, a 6-bit green signal such as $D_2$ and a 6-bit blue signal such as $D_3$.

Figure 5:
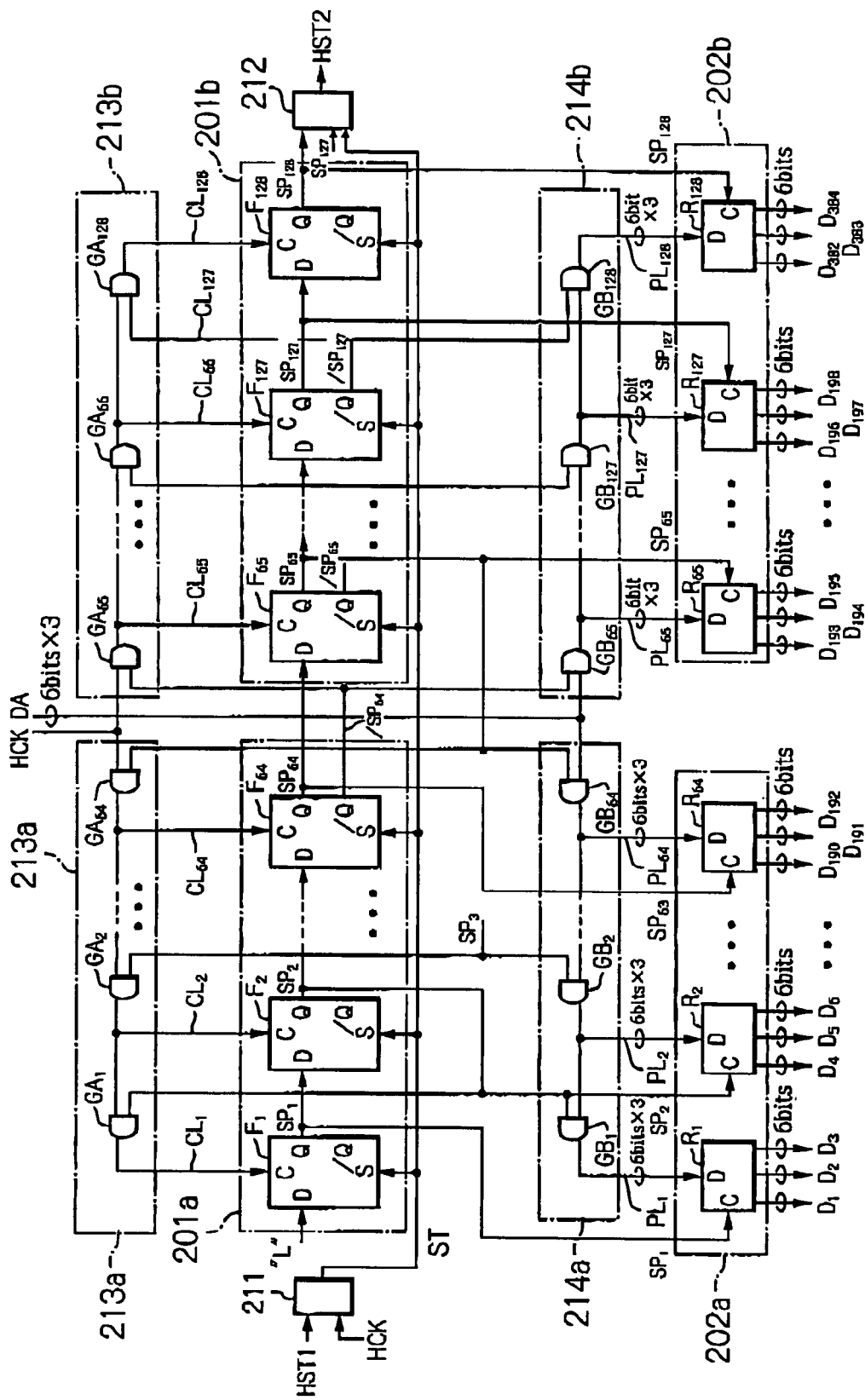
FIG. 5 is a detailed circuit diagram of the horizontal shift registers, the data registers, the clock gate circuits and the pixel gate circuits of FIG. 3.
Figure 6:
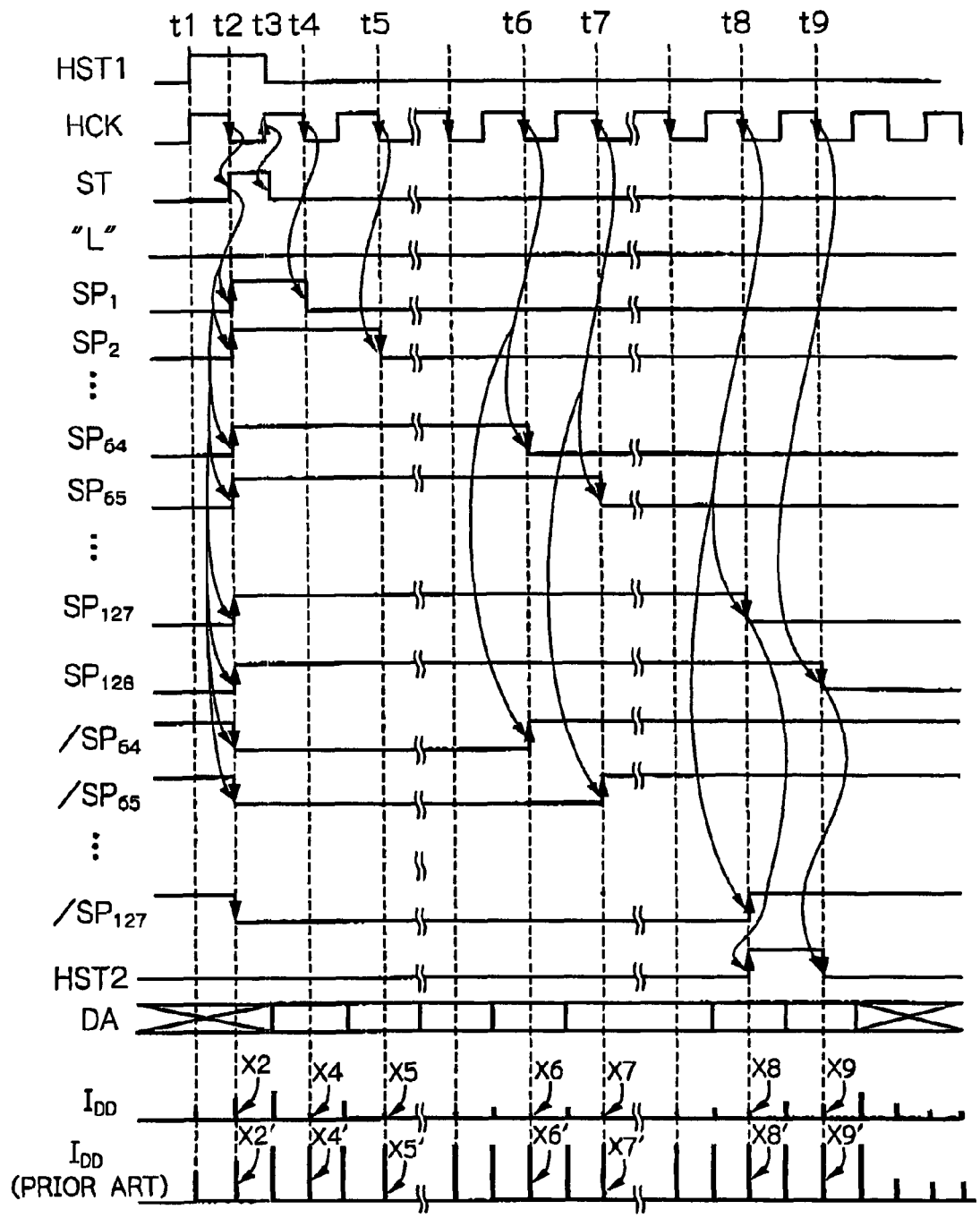
FIG. 6 is a timing diagram for explaining the operation of the data line driver of FIG. 5.

The operation of the circuit of FIG. 5 is explained next with reference to FIG. 6.

First, at time t1, the horizontal start signal HST1 rises. Then, at time t2, the horizontal clock signal HCK falls, so that the set signal ST of the set signal generating circuit 211 rises. As a result, all the set-type D flip-flops $F_1, F_2, \ldots, F_{64}, F_{65}, \ldots, F_{127}, F_{128}$ are set, i.e., all the shift pulse signals $SP_1, SP_2, \ldots, SP_{64}, SP_{65}, \ldots, SP_{127}, SP_{128}$ rise, while the inverted shift pulse signals $/SP_{64}, /SP_{65}, \ldots, /SP_{127}$ fall. Note that the set signal ST falls at time t3 when the horizontal clock signal HCK rises.

Thus, at time t2, in the pre-stage clock gate circuit 213a, the AND circuits $GA_1, GA_2, \ldots, GA_{64}$ are in a pass mode for passing the horizontal clock signal HCK by the leading edges of the shift pulse signals $SP_2, SP_3, \ldots, SP_{65}$. Also, in the pre-stage pixel gate circuit 214a, the AND circuits $GB_1, GB_2, \ldots, GB_{64}$ are in a pass mode for passing the pixel signal DA by the leading edges of the shift pulse signals $SP_2, SP_3, \ldots, SP_{66}$. Therefore, the horizontal clock signal HCK is supplied to the set-type D flip-flops $F_1, F_2, \ldots, F_{64}$, and the pixel signal DA is supplied to the data registers $R_1, R_2, \ldots, R_{64}$.

On the other hand, at time t2, in the post-stage clock gate circuit 213b, the AND circuits $GA_{66}, \ldots, GA_{127}, GA_{128}$ are in a stop mode for stopping the horizontal clock signal HCK by the leading edges of the inverted shift pulse signals $/SP_{64}, \ldots, /SP_{126}, /SP_{127}$. Also, in the post-stage pixel gate circuit 214b, the AND circuits $GB_{65}, \ldots, GB_{127}, GB_{128}$ are in a stop mode for stopping the pixel signal DA by the leading edges of the inverted shift pulse signals $/SP_{64}, \ldots, /SP_{126}, /SP_{127}$. Therefore, the horizontal clock signal HCK is not supplied to the set-type D flip-flops $F_{65}, \ldots, F_{127}, F_{128}$, and the pixel signal DA is not supplied to the data registers $R_{65}, \ldots, R_{127}, R_{128}$, which would decrease the power consumption (see; operating current $I_{DD}$ as indicated by X2 as compared with X2' where no clock gate circuits and no pixel gate circuits are provided).

Next, at time t4, the shift pulse signal $SP_1$ of the set-type D flip-flops $F_1$ falls in synchronization with a falling edge of the horizontal clock signal HCK. As a result, the pixel signal DA is latched by the data register $R_1$ in synchronization with a falling edge of the shift pulse signal $SP_1$. Even in this case, the power consumption would be decreased as indicated by X4 as compared with X4'.

Next, at time t5, the shift pulse signal $SP_2$ of the set-type D flip-flops $F_2$ falls in synchronization with a falling edge of the horizontal clock signal HCK. As a result, the pixel signal DA is latched by the data register $R_2$ in synchronization with a falling edge of the shift pulse signal $SP_2$. Simultaneously, the AND circuits $GA_1$ and $GB_1$ are deactivated by the shift pulse signals $SP_2$, so that the clock signal line $CL_1$ and the pixel line $PL_1$ are forcibly grounded. Thus, the supplying of the horizontal clock signal HCK and the pixel signal DA via the clock signal line $CL_1$ and the pixel line $PL_1$ to the set-type D flip-flop $F_1$ and the data register $R_1$ is prohibited, which would further decrease the power consumption (see: operating current $I_{DD}$ as indicated by X5 as compared with X5').

Next, at time t6, the shift pulse signal $SP_{64}$ of the set-type D flip-flops $F_{64}$ falls in synchronization with a falling edge of the horizontal clock signal HCK. As a result, the pixel signal DA is latched by the data register $R_{64}$ in synchronization with a falling edge of the shift pulse signal $SP_{64}$. Simultaneously, the AND circuits $GA_{63}$ and $GB_{63}$ (not shown) are deactivated by the shift pulse signal $SP_{64}$, so that the clock signal line $CL_{63}$ and the pixel line $PL_{63}$ (not shown) are forcibly grounded. Thus, the supplying of the horizontal clock signal HCK and the pixel signal DA via the clock signal lines $CL_1$, $CL_2$, ..., $CL_{63}$ and the pixel lines $PL_1$, $PL_2$, ..., $PL_{63}$ to the set-type D flip-flops $F_1$, $F_2$, ..., $F_{63}$ and the data registers $R_1$, $R_2$, ..., $R_{63}$ is prohibited, while the supplying of the horizontal clock signal HCK and the pixel signal DA via the clock signal line $CL_{64}$ and the pixel line $PL_{64}$ is allowed. In this case, however, the inverted shift pulse signal $/SP_{64}$ is high. Therefore, in the post-stage clock gate circuit 213b, the AND circuit $GA_{65}$ is in a pass mode for passing the horizontal clock signal HCK by the inverted shift pulse signal $/SP_{64}$. Also, in the post-stage pixel gate circuit 214b, the AND circuit $GB_{65}$ is in a pass mode for passing the pixel signal DA by the inverted shift pulse signal $/SP_{64}$. Therefore, the horizontal clock signal HCK is supplied to the set-type D flip-flop $F_{65}$, and the pixel signal DA is supplied to the data register $R_{56}$. Even in this case, the power consumption would be decreased as indicated by X6 as compared with X6'.

Next, at time t7, the shift pulse signal $SP_{65}$ of the set-type D flip-flops $F_{65}$ falls in synchronization with a falling edge of the horizontal clock signal HCK. As a result, the pixel signal DA is latched by the data register $R_{65}$ in synchronization with a falling edge of the shift pulse signal $SP_{65}$. Simultaneously, the AND circuits $GA_{64}$ and $GB_{64}$ are deactivated by the shift pulse signal $SP_{65}$, so that the clock signal line $CL_{64}$ and the pixel line $PL_{64}$ are forcibly grounded. Thus, the supplying of the horizontal clock signal HCK and the pixel signal DA via the clock signal lines $CL_1$, $CL_2$, ..., $CL_{64}$ and the pixel lines $PL_1$, $PL_2$, ..., $PL_{64}$ to the set-type D flip-flops $F_1$, $F_2$, ..., $F_{64}$ and the data registers $R_1$, $R_2$, ..., $R_{64}$ is prohibited. In this case, however, the inverted shift pulse signal $/SP_{65}$ is high. Therefore, in the post-stage clock gate circuit 213b, the AND circuit $GA_{56}$ is in a pass mode for passing the horizontal clock signal HCK by the inverted shift pulse signal $/SP_{65}$. Also, in the post-stage pixel gate circuit 214b, the AND circuit $GB_{66}$ is in a pass mode for passing the pixel signal DA by the inverted shift pulse signal $/SP_{66}$. Therefore, the horizontal clock signal HCK is supplied to the set-type D flip-flop $F_{65}$, and the pixel signal DA is supplied to the data register $R_{66}$. Even in this case, the power consumption would be decreased as indicated by X7 as compared with X7'.

Thus, from time t2 to time t7, the number of activated AND circuits in the pre-stage clock gate circuit 213a and the number of activated AND circuits in the pre-stage pixel gate circuit 214a are both sequentially decreased by the trailing edges of the shift pulse signals $SP_2$, ..., $SP_{64}$, $SP_{65}$, so that the capacitance of the clock signal lines and the capacitance of the pixel lines are substantially decreased step by step. In this case, note that the post-stage clock gate circuit 213b and the post-stage pixel gate circuit 214b are completely deactivated except the time period from time t6 to time t7 where only the AND circuits $GA_{65}$ and $GB_{65}$ are activated.

Next, at time t8, the shift pulse signal $SP_{127}$ of the set-type D flip-flops $F_{127}$ falls in synchronization with a falling edge of the horizontal clock signal HCK. As a result, the pixel signal DA is latched by the data register $R_{127}$ in synchronization with a falling edge of the shift pulse signal $SP_{127}$. Simultaneously, since the inverted shift pulse signal $/SP_{127}$ is high, the AND circuits $GA_{128}$ and $GB_{128}$ of the post-stage clock gate circuit 213b and the post-stage pixel gate circuit 214b are activated by the inverted shift pulse signal $/SP_{127}$, so that the clock signal line $CL_{128}$ and the pixel line $PL_{128}$ are activated. Thus, the supplying of the horizontal clock signal HCK and the pixel signal DA via the clock signal lines $CL_{65}$, $CL_{66}$, ..., $CL_{127}$, $CL_{128}$ and the pixel lines $PL_{65}$, $PL_{66}$, ..., $PL_{127}$, $PL_{128}$ to the set-type D flip-flops $F_{65}$, $F_{66}$, ..., $F_{127}$, $F_{128}$ and the data registers $R_{65}$, $R_{66}$, ..., $R_{127}$, $R_{128}$ is allowed. Even in this case, the power consumption would be decreased as indicated by X8 as compared with X8'.

Next, at time t9, the shift pulse signal $SP_{128}$ of the set-type D flip-flops $F_{128}$ falls in synchronization with a falling edge of the horizontal clock signal HCK. As a result, the pixel signal DA is latched by the data register $R_{128}$ in synchronization with a falling edge of the shift pulse signal $SP_{128}$. Even in this case, the power consumption would be decreased as indicated by X9 as compared with X9'.

Thus, from time t6 to time t9, the number of activated AND circuits in the post-stage clock gate circuit 213b and the number of activated AND circuits in the post-stage pixel gate circuit 214b are both sequentially increased by the trailing edges of the inverted shift pulse signals $/SP_{64}$, $/SP_{65}$, ..., $/SP_{127}$, so that the capacitance of the clock signal lines and the capacitance of the pixel lines are substantially increased step by step. In this case, note that the pre-stage clock gate circuit 213a and the pre-stage pixel gate circuit 214a are completely deactivated except the time period from time t6 to time t7 where only the AND circuits $GA_{64}$ and $GB_{64}$ are activated.

Finally, the start signal generating circuit 212 generates a horizontal start signal HST2 for the next data line driver 2-2 (see: FIG. 1) in response to the falling edges of the shift pulse signals $SP_{127}$ and $SP_{128}$.

Thus, in the first embodiment as illustrated in FIGS. 3 and 5, a horizontal shift register is divided into the pre-stage horizontal shift register 201a and the post-stage horizontal shift register 201b, and a data register is divided into the pre-stage data register 202a and the post-stage data register 202b. Also, a clock signal line for the horizontal clock signal HCK is divided into two clock signal line groups, i.e., a first clock signal line group formed by the clock signal lines $CL_1$, $CL_2$, ..., $CL_{64}$ controlled by the clock gate circuit 213a and, a second clock signal line group formed by the clock signal lines $CL_{65}$, ..., $CL_{127}$, $CL_{128}$ controlled by the clock gate circuit 213b. Further, a pixel line for the pixel signal DA is divided into two pixel line groups, i.e., a first pixel line group formed by the pixel lines $PL_1$, $PL_2$, ..., $PL_{64}$ controlled by the pixel gate circuit 214a and a second pixel line group formed by the pixel lines $PL_{65}$, ..., $PL_{127}$, $PL_{128}$ controlled by the pixel gate circuit 214b. The supplying of the horizontal clock signal HCK to the clock signal lines $CL_1$, $CL_2$, ..., $CL_{64}$, $CL_{65}$, ..., $CL_{127}$ and $CL_{128}$ and the supplying of the pixel signal DA to the pixel lines $PL_1$, $PL_2$, ..., $PL_{64}$, $PL_{65}$, ..., $PL_{127}$ and $PL_{128}$ are allowed and prohibited in accordance with the shift pulse signals $SP_2$, $SP_3$, ..., $SP_{65}$ and the inverted shift pulse signals $/SP_{64}$, ..., $/SP_{126}$, $/SP_{127}$. As a result, the load of the horizontal clock signal HCK and the load of the pixel signal DA can be decreased without creating the problems of the above-described first, second and third prior art semiconductor integrated circuit devices. Therefore, even when the horizontal clock signal HCK and the pixel signal DA are at a higher speed, the operating current $I_{DD}$ can be decreased, so that the power consumption can be decreased and the electromagnetic interference (EMI) can be decreased. Further, since the AND circuits are cascaded within each of the clock gate circuits 213a and 213b and the pixel gate circuits 214a and 214b, the penetration currents can be dispersed by the operation delay times of the cascaded AND circuits.

In the above-described first embodiment, each AND circuit such as $GA_1$ and $GB_1$ is provided for one stage such as the set-type D flip-flop $F_1$ and the data register $R_1$; however, each AND circuit can be provided for every two or more stages.

Figure 7:
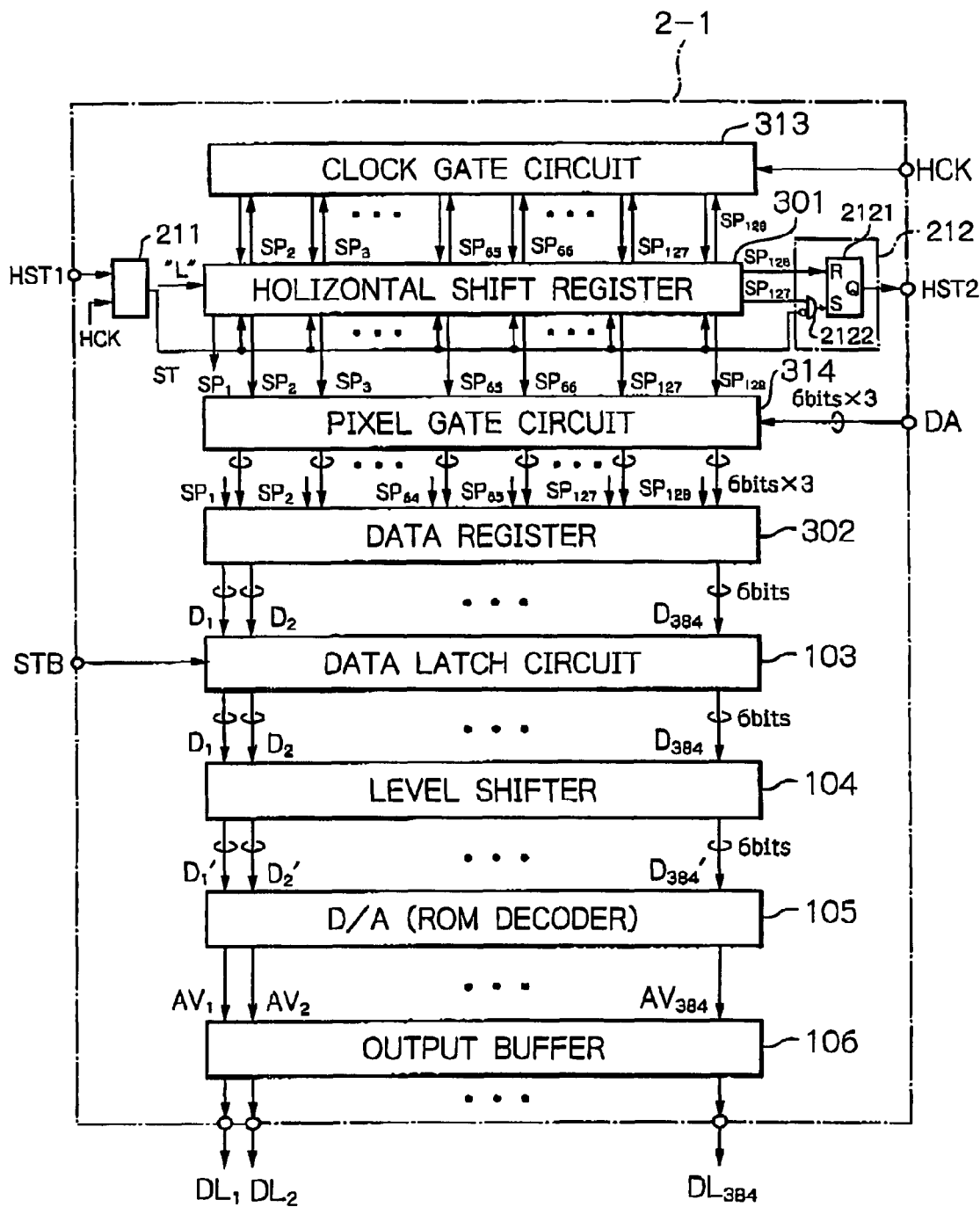
FIG. 7 is a block circuit diagram illustrating a second embodiment of the semiconductor integrated circuit device according to the present invention applied to a data line driver.

In FIG. 7, which illustrates a second embodiment of the semiconductor integrated circuit device according to the present invention applied to one of the data line drivers such as 2-1 of FIG. 1, the pre-stage horizontal shift register 201a and the post-stage horizontal shift register 201b of FIG. 3 is replaced by a single horizontal shift register 301 for receiving a low level signal "L" such as the ground voltage to generate shift pulse signals $SP_1, SP_2, SP_3, \ldots, SP_{64}, SP_{65}, \ldots, SP_{127}, SP_{128}$. That is, the horizontal shift register 301 is obtained by extending the pre-stage horizontal shift register 201a of FIG. 3.

Also, the pre-stage data register 202a and the post-stage data register 202b of FIG. 3 are replaced by a single data register 302 for latching the pixel signal DA in synchronization with the shift pulse signals $SP_1, SP_2, \ldots, SP_{64}, SP_{65}, \ldots, SP_{127}, SP_{128}$. That is, the data register 302 is obtained by extending the pre-stage data register 202a of FIG. 3.

The pre-stage clock gate circuit 213a and the post-stage clock gate circuit 213b of FIG. 3 are replaced by a single-clock gate circuit (logic circuit) 313 which receives the horizontal clock signal HCK at an input end and supplies it from a plurality of output ends to the horizontal shift register 301 in synchronization with the shift pulse signals $SP_2, SP_3, \ldots, SP_{65}, SP_{66}, \ldots, SP_{127}, SP_{128}$ as well as the horizontal clock signal HCK per se. In this case, the horizontal clock signal HCK is switched ON and OFF (or allowed and prohibited) at the output ends by the shift pulse signals $SP_2, SP_3, \ldots, SP_{65}, SP_{66}, \ldots, SP_{127}, SP_{128}$, respectively. That is, the clock gate circuit 313 is obtained by extending the pre-stage clock gate circuit 213a of FIG. 3.

The pre-stage pixel gate circuit 214a and the post-stage pixel gate circuit 214b of FIG. 3 are replaced by a single pixel gate circuit (logic circuit) 314 which receives the pixel signal DA at an input end and supplies it from a plurality of output ends to the data register 302 in synchronization with the shift pulse signals $SP_2, SP_3, \ldots, SP_{128}$. In this case, the pixel signal DA is switched ON and OFF (or allowed and prohibited) at the output ends by the shift pulse signals $SP_2, SP_3, \ldots, SP_{65}, SP_{66}, \ldots, SP_{127}, SP_{128}$, respectively. That is, the pixel gate circuit 314 is obtained by extending the pre-stage pixel gate circuit 214a of FIG. 3.

The horizontal shift register 301, the data register 302, the clock gate circuit 313 and the pixel gate circuit 314 are explained next in detail with reference to FIG. 8.

The shift register 301 is constructed by set-type D flip-flops $F_1, F_2, \ldots, F_{64}, F_{65}, \ldots, F_{127}, F_{128}$. The set-type D flip-flops $F_1, F_2, \ldots, F_{128}$, are cascaded. That is, the output Q of the set-type D flip-flops $F_i$ (I=1, 2, \ldots, 127) is connected to the data input D of the set-type D flip-flop $F_{i+1}$. Supplied to the data input D of the set-type D flip-flop $F_1$ is a low level signal "L", not the horizontal start signal HST1. Also, the horizontal clock signal HCK is supplied via the clock gate circuit 313 to the clock inputs C of the set-type D flip-flops $F_1, F_2, \ldots, F_{128}$. The outputs Q of the set-type D flip-flops $F_1, F_2, \ldots, F_{128}$ generate the shift pulse signals $SP_1, SP_2, \ldots, SP_{128}$, respectively. Also, the set signal ST is supplied to the set inputs S of the set-type D flip-flops $F_1, F_2, \ldots, F_{128}$. As a result, when the set signal ST rises, the set-type D flip-flops $F_1, F_2, \ldots, F_{128}$ are set, so that their outputs Q show a high level. After the set-type D flip-flops $F_1, F_2, \ldots, F_{128}$ are set by the set signal ST, the set-type D flip-flops $F_1, F_2, \ldots, F_{128}$ shift the low level signal "L" in synchronization with the horizontal clock signal HCK.

The data register 302 is constructed by 18-bit data registers $R_1, R_2, \ldots, R_{64}, R_{65}, \ldots, R_{127}, R_{128}$. The 18-bit data registers $R_1, R_2, \ldots, R_{64}, R_{65}, \ldots, R_{127}, R_{128}$ latch the 18-bit pixel signal DA in synchronization with falling edges of the shift pulse signals $SP_1, SP_2, \ldots, SP_{64}, SP_{65}, \ldots, SP_{127}, SP_{128}$, respectively.

The clock gate circuit 313 is constructed by cascaded AND circuits $GA_1, GA_2, \ldots, GA_{64}, GA_{65}, \ldots, GA_{127}$. That is, connected to an input of the AND circuit $GA_i$ (i=1, 2, \ldots, 126) is the output of the AND circuit $GA_{i+1}$. Also, an input of the AND circuit $GA_{127}$ receives the horizontal clock signal HCK. Supplied to the other input of the AND circuit $GA_i$ (i=1, 2, \ldots, 127) is the shift pulse signal $SP_{i+1}$. The outputs of the AND circuits $GA_1, GA_2, \ldots, GA_{127}$ are connected via clock signal lines $CL_1, CL_2, \ldots, CL_{127}$ to the clock inputs C of the set-type D flip-flops $F_1, F_2, \ldots, F_{127}$, respectively. As a result, the clock signal lines $CL_1, CL_2, \ldots, CL_{127}$ are sequentially grounded in synchronization with the falling edges of the shift pulse signals $SP_2, SP_3, \ldots, SP_{128}$, respectively. Therefore, first, the horizontal clock signal HCK is supplied via the clock signal lines $CL_1, CL_2, \ldots, CL_{128}$ to all the set-type D flip-flops $F_1, F_2, \ldots, F_{128}$. Then, the supplying of the horizontal clock signal HCK via the clock signal line $CL_1$ to the set-type D flip-flop $F_1$ is prohibited, so that the horizontal clock signal HCK is supplied via the clock signal lines $CL_2, CL_3, \ldots, CL_{128}$ to only the set-type D flip-flops $F_2, F_3, \ldots, F_{128}$. Finally, the supplying of the horizontal clock signal HCK via the clock signal lines $CL_1, CL_2, \ldots, CL_{127}$ to the set-type D flip-flops $F_1, F_2, \ldots, F_{127}$ is prohibited, so that the horizontal clock signal HCK is not supplied to any of the set-type D flip-flops $F_1, F_2, \ldots, F_{127}$.

The pixel gate circuit 314 is constructed by cascaded AND circuits $GB_1, GB_2, \ldots, GB_{127}$. That is, connected to an input of the AND circuit $GB_i$ (i=1, 2, \ldots, 126) is the output of the AND circuit $GB_{i+1}$. Also, an input of the AND circuit $GB_{127}$ receives the pixel signal DA. Supplied to the other input of the AND circuit $GB_i$ (i=1, 2, \ldots, 127) is the shift pulse signal $SP_{i+1}$. The outputs of the AND circuits $GB_1, GB_2, \ldots, GB_{127}$ are connected via 18-bit pixel lines $PL_1, PL_2, \ldots, PL_{127}$ to the data inputs D of the 18-bit data registers $R_1, R_2, \ldots, R_{127}$, respectively. As a result, the pixel lines $PL_1, PL_2, \ldots, PL_{127}$ are sequentially grounded in synchronization with the falling edges of the shift pulse signals $SP_2, SP_3, \ldots, SP_{128}$, respectively. Therefore, first, the 18-bit pixel signal DA is supplied via the pixel lines $PL_1, PL_2, \ldots, PL_{128}$ to all the 18-bit data registers $R_1, R_2, \ldots, R_{128}$. Then, the supplying of the 18-bit pixel signal DA via the pixel line $PL_1$ to the 18-bit data register $R_1$ is prohibited, so that the 18-bit pixel signal DA is supplied via the pixel lines $PL_2, PL_3, \ldots, PL_{128}$ to only the 18-bit data registers $R_2, R_3, \ldots, R_{128}$. Finally, the supplying of the 18-bit pixel signal DA via the pixel lines $PL_1, PL_2, \ldots, PL_{127}$ to the 18-bit data registers $R_1, R_2, \ldots, R_{127}$ is prohibited, so that the 18-bit pixel signal DA is not supplied to any of the 18-bit data registers $R_1, R_2, \ldots, R_{127}$.

Note that each of the 18-bit data registers $R_1, R_2, \ldots, R_{128}$ generate 6-bit video signals such as a 6-bit red signal such as $D_1$, a 6-bit green signal such as $D_2$ and a 6-bit blue signal such as $D_3$.

Figure 8:
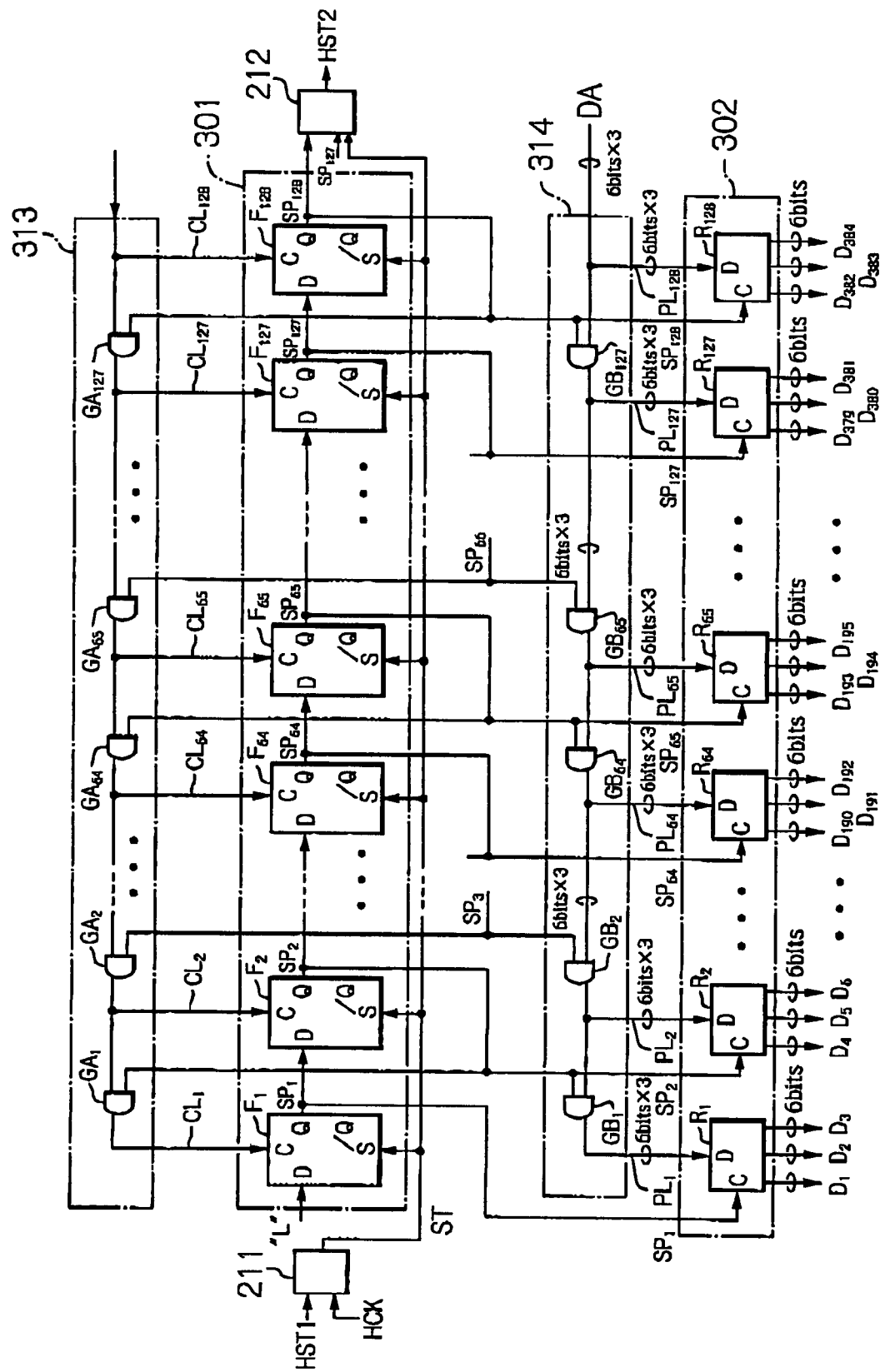
FIG. 8 is a detailed circuit diagram of the horizontal shift register, the data register, the clock gate circuit and the pixel gate circuit of FIG. 7.
Figure 9:
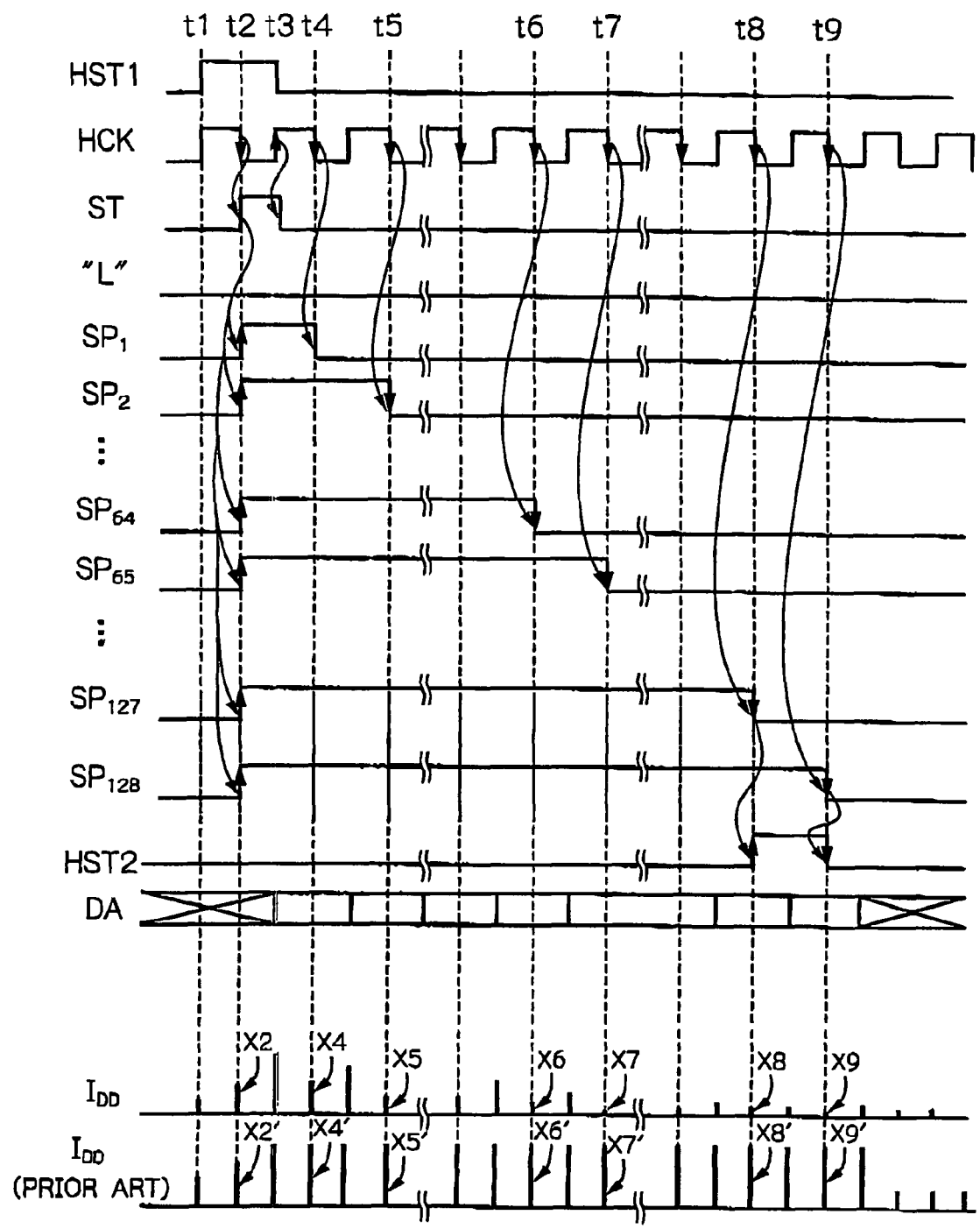
FIG. 9 is a timing diagram for explaining the operation of the data line driver of FIG. 8.

The operation of the circuit of FIG. 8 is explained next with reference to FIG. 9.

First, at time t1, the horizontal start signal HST1 rises. Then, at time t2, the horizontal clock signal HCK falls, so that the set signal ST of the set signal generating circuit 211 rises. As a result, all the set-type D flip-flops $F_1, F_2, \ldots, F_{64}, F_{65}, \ldots, F_{127}, F_{128}$ are set, i.e., all the shift pulse signals $SP_1, SP_2, \ldots, SP_{64}, SP_{65}, \ldots, SP_{127}, SP_{128}$ rise. Note that the set signal ST falls at time t3 when the horizontal clock signal HCK rises.

Thus, at time t2, in the clock gate circuit 313, the AND circuits $GA_1, GA_2, \ldots, GA_{64}, GA_{65}, \ldots GA_{127}$ are in a pass mode for passing the horizontal clock signal HCK by the leading edges of the shift pulse signals $SP_2, SP_3, \ldots, SP_{65}, SP_{66}, \ldots, SP_{128}$. Also, in the pixel gate circuit 314, the AND circuits $GB_1, GB_2, \ldots, GB_{64}, GB_{65}, \ldots, GB_{127}$ are in a pass mode for passing the pixel signal DA by the leading edges of the shift pulse signals $SP_2, SP_3, \ldots, SP_{65}, SP_{66}, \ldots, SP_{128}$. Therefore, the horizontal clock signal HCK is supplied to the set-type D flip-flops $F_1, F_2, \ldots, F_{64}, F_{65}, \ldots, F_{127}$ and $F_{128}$, and the pixel signal DA is supplied to the data registers $R_1, R_2, \ldots, R_{64}, R_{65}, \ldots, R_{127}$ and $R_{128}$. In this case, the operating current $I_{DD}$ as indicated by X2 corresponds to X2' where no clock gate circuits and no pixel gate circuits are provided.

Next, at time t4, the shift pulse signal $SP_1$ of the set-type D flip-flops $F_1$ falls in synchronization with a falling edge of the horizontal clock signal HCK. As a result, the pixel-signal DA is latched by the data register $R_1$ in synchronization with a falling edge of the shift pulse signal $SP_1$. In this case, the power consumption would be decreased as indicated by X4 as compared with X4'.

Next, at time t5, the shift pulse signal $SP_2$ of the set-type D flip-flops $F_2$ falls in synchronization with a falling edge of the horizontal clock signal HCK. As a result, the pixel signal DA is latched by the data register $R_2$ in synchronization with a falling edge of the shift pulse signal $SP_2$. Simultaneously, the AND circuits $GA_1$ and $GB_1$ are deactivated by the shift pulse signal $SP_2$, so that the clock signal line $CL_1$ and the pixel line $PL_1$ are forcibly grounded. Thus, the supplying of the horizontal clock signal HCK and the pixel signal DA via the clock signal line $CL_1$ and the pixel line $PL_1$ to the set-type D flip-flop $F_1$ and the data register $R_1$ is prohibited, which would further decrease the power consumption (see: operating current $I_{DD}$ as indicated by X5 as compared with X5').

Next, at time t6, the shift pulse signal $SP_{64}$ of the set-type D flip-flops $F_{64}$ falls in synchronization with a falling edge of the horizontal clock signal HCK. As a result, the pixel signal DA is latched by the data register $R_{64}$ in synchronization with a falling edge of the shift pulse signal $SP_{64}$. Simultaneously, the AND circuits $GA_{63}$ and $GB_{63}$, (not shown) are deactivated by the shift pulse signal $SP_{64}$, so that the clock signal line $CL_{63}$ and the pixel line $PL_{63}$ (not shown) are forcibly grounded. Thus, the supplying of the horizontal clock signal HCK and the pixel signal DA via the clock signal lines $CL_1, CL_2, \ldots, CL_{63}$ and the pixel lines $PL_1, PL_2, \ldots, PL_{63}$ to the set-type D flip-flops $F_1, F_2, \ldots, F_{63}$ and the data registers $R_1, R_2, \ldots, R_{63}$ is prohibited, while the supplying of the horizontal clock signal HCK and the pixel signal DA via the clock signal lines $CL_{64}, CL_{65}, \ldots, CL_{127}, CL_{128}$ and the pixel lines $PL_{64}, PL_{65}, \ldots, PL_{127}, PL_{128}$ is allowed. Even in this case, the power consumption would be decreased as indicated by X6 as compared with X6'.

Next, at time t7, the shift pulse signal $SP_{65}$ of the set-type D flip-flops $F_{65}$ falls in synchronization with a falling edge of the horizontal clock signal HCK. As a result, the pixel signal DA is latched by the data register $R_{65}$ in synchronization with a falling edge of the shift pulse signal $SP_{65}$. Simultaneously, the AND circuits $GA_{64}$ and $GB_{64}$ are deactivated by the shift pulse signal $SP_{65}$, so that the clock signal line $CL_{64}$ and the pixel line $PL_{64}$ are forcibly grounded. Thus, the supplying of the horizontal clock signal HCK and the pixel signal DA via the clock signal lines $CL_1, CL_2, \ldots, CL_{64}$ and the pixel lines $PL_1, PL_2, \ldots, PL_{64}$ to the set-type D flip-flops $F_1, F_2, \ldots, F_{64}$ and the data registers $R_1, R_2, \ldots, R_{64}$ is prohibited. Even in this case, the power consumption would be decreased as indicated by X7 as compared with X7'.

Next, at time t8, the shift pulse signal $SP_{127}$ of the set-type D flip-flops $F_{127}$ falls in synchronization with a falling edge of the horizontal clock signal HCK. As a result, the pixel signal DA is latched by the data register $R_{127}$ in synchronization with a falling edge of the shift pulse signal $SP_{127}$. Thus, the supplying of the horizontal clock signal HCK and the pixel signal DA via the clock signal lines $CL_1, CL_2, \ldots, CL_{64}, CL_{65}, \ldots, CL_{126}$, and the pixel lines $PL_1, PL_2, \ldots, PL_{64}, PL_{65}, \ldots, PL_{126}$, to the set-type D flip-flops $F_1, F_2, \ldots, F_{64}, F_{65}, \ldots, F_{126}$ and the data registers $R_1, R_2, \ldots, R_{64}, R_{65}, \ldots, R_{126}$ is prohibited. Even in this case, the power consumption would be decreased as indicated by X8 as compared with X8'.

Next, at time t9, the shift pulse signal $SP_{128}$ of the set-type D flip-flops $F_{128}$ falls in synchronization with a falling edge of the horizontal clock signal HCK. As a result, the pixel signal DA is latched by the data register $R_{128}$ in synchronization with a falling edge of the shift pulse signal $SP_{128}$. Thus, the supplying of the horizontal clock signal HCK and the pixel signal DA via the clock signal lines $CL_1, CL_2, \ldots, CL_{64}, CL_{65}, \ldots, CL_{126}, CL_{127}$ and the pixel lines $PL_1, PL_2, \ldots, PL_{64}, PL_{65}, \ldots, PL_{126}, PL_{127}$ to the set-type D flip-flops $F_1, F_2, \ldots, F_{64}, F_{65}, \ldots, F_{126}, F_{127}$ and the data registers $R_1, R_2, \ldots, R_{64}, R_{65}, \ldots, R_{126}, R_{127}$ is prohibited. Even in this case, the power consumption would be decreased as indicated by X9 as compared with X9'.

Thus, from time t2 to time t9, the number of activated AND circuits in the clock gate circuit 313 and the number of activated AND circuits in the pixel gate circuit 314 are both sequentially decreased by the trailing edges of the shift pulse signals $SP_2, \ldots, SP_{64}, SP_{65}, \ldots, SP_{127}, SP_{128}$, so that the capacitance of the clock signal lines and the capacitance of the pixel lines are substantially decreased step by step.

Finally, the start signal generating circuit 212 generates a horizontal start signal HST2 for the next data line driver 2-2 (see: FIG. 1) in response to the falling edges of the shift pulse signals $SP_{127}$ and $SP_{128}$.

Thus, in the second embodiment as illustrated in FIGS. 7 and 8, the supplying of the horizontal clock signal HCK to the clock signal lines $CL_1, CL_2, \ldots, CL_{64}, CL_{65}, \ldots, CL_{127}$ and the supplying of the pixel signal DA to the pixel lines $PL_1, PL_2, \ldots, PL_{64}, PL_{65}, \ldots, PL_{127}$ are allowed and prohibited in accordance with the shift pulse signals $SP_2, SP_3, \ldots, SP_{128}$. As a result, the load of the horizontal clock signal HCK and the load of the pixel signal DA can be decreased without creating the problems of the above-described first, second and third prior art semiconductor integrated circuit devices. Therefore, even when the horizontal clock signal HCK and the pixel signal DA are at a higher speed, the operating current $I_{DD}$ can be decreased, so that the power consumption can be decreased and the electromagnetic interference (EMI) can be decreased. Further, since the AND circuits are cascaded within each of the clock gate circuits 313 and the pixel gate circuits 314, the penetration currents can be dispersed by the operation delay times of the cascaded AND circuits.

In the above-described second embodiment, each AND circuit such as $GA_1$ and $GB_1$ is provided for one stage such as the set-type D flip-flop $F_1$ and the data register $R_1$; however, each AND circuit can be provided for every two or more stages.

Figure 10:
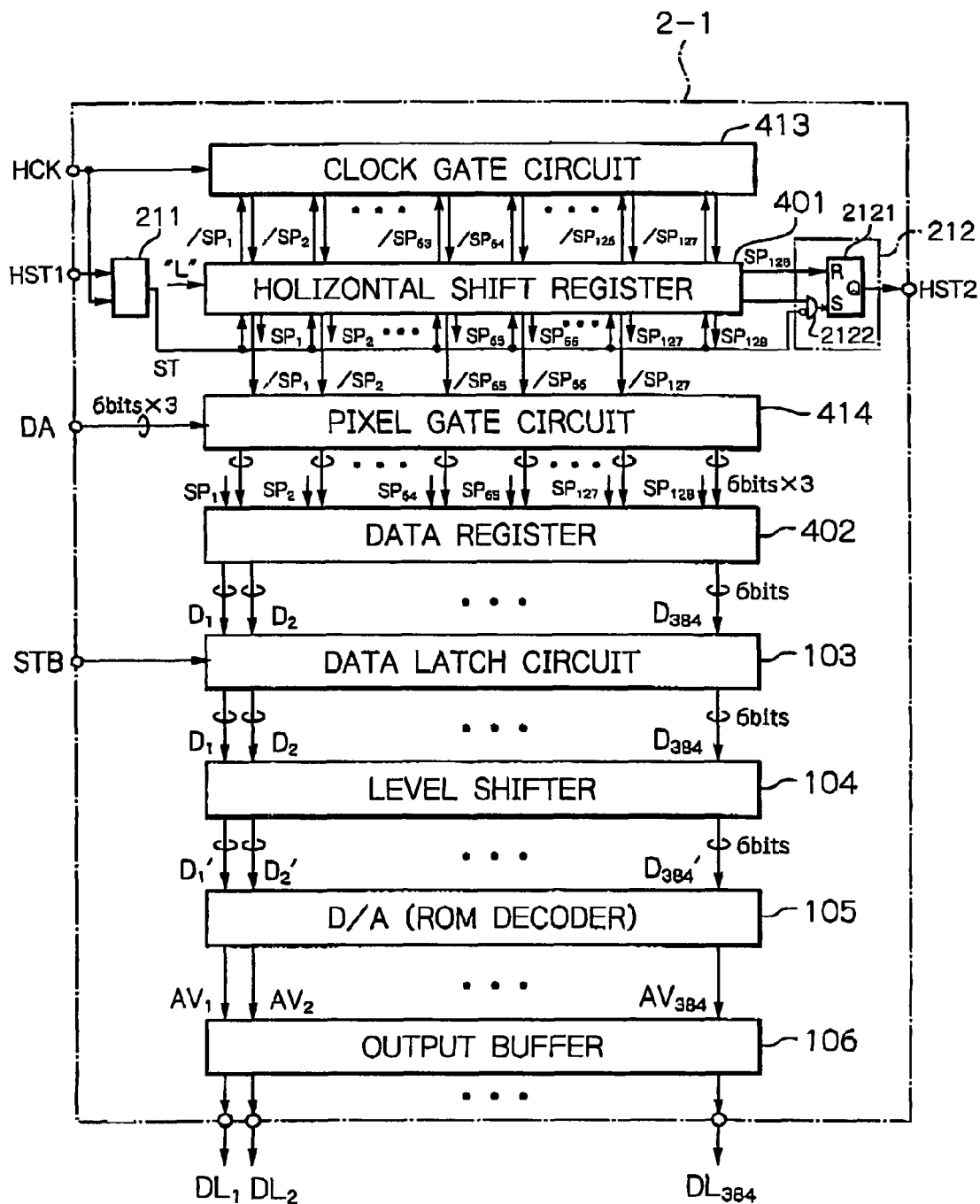
FIG. 10 is a block circuit diagram illustrating a third embodiment of the semiconductor integrated circuit device according to the present invention applied to a data line driver.

In FIG. 10, which illustrates a third embodiment of the semiconductor integrated circuit device according to the present invention applied to one of the data line drivers such as 2-1 of FIG. 1, the pre-stage horizontal shift register 201a and the post-stage horizontal shift register 201b of FIG. 3 are replaced by a single horizontal shift register 401 for receiving a low level signal "L" such as the ground voltage to generate shift pulse signals $SP_1, SP_2, SP_3, \ldots, SP_{64}, SP_{65}, \ldots, SP_{127}, SP_{128}$, and inverted shift pulse signals $/SP_1, /SP_2, \ldots, /SP_{64}, /SP_{65}, \ldots, SP_{127}$. That is, the horizontal shift register 401 is obtained by extending the post-stage horizontal shift register 201b of FIG. 3.

Also, the pre-stage data register 202a and the post-stage data register 202b of FIG. 3 is replaced by a single data register 402 for latching the pixel signal DA in synchronization with the shift pulse signals $SP_1, SP_2, \ldots, SP_{64}, SP_{65}, \ldots, SP_{127}, SP_{128}$. That is, the data register 402 is obtained by extending the post-stage data register 202b of FIG. 3.

The pre-stage clock gate circuit 213a and the post-stage clock gate circuit 213b of FIG. 3 are replaced by a single clock gate circuit (logic circuit) 413 which receives the horizontal clock signal HCK at an input end and supplies it from a plurality of output ends to the horizontal shift register 401 in synchronization with the inverted shift pulse signals $/SP_1, /SP_2, \ldots, /SP_{64}, /SP_{65} \ldots /SP_{127}$ as well as the horizontal clock signal HCK per se. In this case, the horizontal clock signal HCK is switched ON and OFF (or allowed and prohibited) at the output ends by the inverted shift pulse signals $/SP_2, /SP_3, \ldots, /SP_{64}, /SP_{65}, \ldots, /SP_{127}$, respectively. That is, the clock gate circuit 313 is obtained by extending the post-stage clock gate circuit 213b of FIG. 3.

The pre-stage pixel gate circuit 214a and the post-stage pixel gate circuit 214b of FIG. 3 are replaced by a single pixel gate circuit (logic circuit) 414 which receives the pixel signal DA at an input end and supplies it from a plurality of output ends to the data register 402 in synchronization with the inverted shift pulse signals $/SP_2, /SP_3, \ldots, /SP_{64}, /SP_{65}, \ldots, /SP_{126}, /SP_{127}$ as well as the pixel signal DA per se. In this case, the pixel signal DA is switched ON and OFF (or allowed and prohibited) at the output ends by the shift pulse signals $/SP_2, /SP_3, \ldots, /SP_{64}, /SP_{65}, \ldots, SP_{126}, SP_{127}$, respectively. That is, the pixel gate circuit 414 is obtained by extending the post-stage pixel gate circuit 214b of FIG. 3.

The horizontal shift register 401, the data register 402, the clock gate circuit 413 and the pixel gate circuit 414 are explained next in detail with reference to FIG. 11.

The shift register 401 is constructed by set-type D flip-flops $F_1, F_2, \ldots, F_{64}, F_{65}, \ldots, F_{127}, F_{128}$. The set-type D flip-flops $F_1, F_2, \ldots, F_{128}$ are cascaded. That is, the output Q of the set-type D flip-flops $F_i$ (i=1, 2, ..., 127) is connected to the data input D of the set-type D flip-flop $F_{i+1}$. Supplied to the data input D of the set-type D flip-flop $F_1$ is a low level signal "L", not the horizontal start signal HST1. Also, the horizontal clock signal HCK is supplied via the clock gate circuit 413 to the clock inputs C of the set-type D flip-flops $F_1, F_2, \ldots, F_{128}$. The outputs Q of the set-type D flip-flops $F_1, F_2, \ldots, F_{128}$ generate the shift pulse signals $SP_1, SP_2, \ldots, SP_{128}$, respectively. Also, the outputs /Q of the set-type D flip-flops $F_1, \ldots, F_{64}, F_{65}, \ldots, F_{127}$ generate the inverted shift pulse signals $/SP_1, \ldots, /SP_{64}, /SP_{65}, \ldots, /SP_{127}$, respectively. Further, the set signal ST is supplied to the set inputs S of the set-type D flip-flops $F_1, F_2, \ldots, F_{128}$. As a result, when the set signal ST rises, the set-type D flip-flops $F_1, F_2, \ldots, F_{128}$ are set, so that their outputs Q show a high level and their output /Q generate a low level. After the set-type D flip-flops $F_1, F_2, \ldots, F_{128}$ are set by the set signal ST, the set-type D flip-flops $F_1, F_2, \ldots, F_{128}$ shift the low level signal "L" in synchronization with the horizontal clock signal HCK.

The data register 402 is constructed by 18-bit data registers $R_1, R_2, \ldots, R_{64}, R_{65}, \ldots, R_{127}, R_{128}$. The 18-bit data registers $R_1, R_2, \ldots, R_{64}, R_{65}, \ldots, R_{127}, R_{128}$ latch the 18-bit pixel signal DA in synchronization with falling edges of the shift pulse signals $SP_1, SP_2, \ldots, SP_{64}, SP_{65}, \ldots, SP_{127}, SP_{128}$, respectively.

The clock gate circuit 413 is constructed by cascaded AND circuits $GA_2, \ldots, GA_{64}, GA_{65}, \ldots, GA_{127}, GA_{128}$. That is, connected to an input of the AND circuit $GA_i$ (i=3, ..., 128) is the output of the AND circuit $GA_{i-1}$. Also, an input of the AND circuit $GA_2$ receives the horizontal clock signal HCK. Supplied to the other input of the AND circuit $GA_i$ (i=2, ..., 128) is the shift pulse signal $SP_{i-1}$. The outputs of the AND circuits $GA_2, \ldots, GA_{64}, GA_{65}, \ldots, GA_{127}, GA_{128}$ are connected via clock signal lines $CL_2, \ldots, CL_{64}, CL_{65}, \ldots, CL_{127}, CL_{128}$ to the clock inputs C of the set-type D flip-flops $F_2, \ldots, F_{64}, F_{65}, \ldots, F_{127}, F_{128}$, respectively. The horizontal clock signal HCK is directly supplied to the clock input of the set-type D flip-flop $F_1$. As a result, the clock signal lines $CL_1, CL_2, \ldots, CL_{127}$ are sequentially activated in synchronization with the rising edges of the inverted shift pulse signals $/SP_1, \ldots, /SP_{63}, /SP_{64}, \ldots, /SP_{126}, /SP_{127}$, respectively. Therefore, first, the horizontal clock signal HCK is supplied via the clock signal lines $CL_1$ to only the set-type D flip-flop $F_1$. Then, the supplying of the horizontal clock signal HCK via the clock signal line $CL_1$ to the set-type D flip-flop $F_1$ is allowed, so that the horizontal clock signal HCK is supplied via the clock signal line $CL_2$ to the set-type D flip-flop $F_2$ as well as the set type D flip-flop $F_1$. Finally, the supplying of the horizontal clock signal HCK via the clock signal lines $CL_1, CL_2, \ldots, CL_{128}$ to the set-type D flip-flops $F_1, F_2, \ldots, F_{128}$ is allowed, so that the horizontal clock signal HCK is supplied to all of the set-type D flip-flops $F_1, F_2, \ldots, F_{128}$.

The pixel gate circuit 414 is constructed by cascaded AND circuits $GB_2, \ldots, GB_{128}$. That is, connected to an input of the AND circuit $GB_i$ (i=3, ..., 128) is the output of the AND circuit $GB_{i-1}$. Also, an input of the AND circuit $GB_2$ receives the pixel signal DA. Supplied to the other input of the AND circuit $GB_i$ (i=2, ..., 128) is the shift pulse signal $SP_{i-1}$. The outputs of the AND circuits $GB_2, \ldots, GB_{128}$ are connected via 18-bit pixel lines $PL_2, \ldots, PL_{128}$ to the data inputs D of the 18-bit data registers $R_2, \ldots, R_{128}$, respectively. The pixel signal DA is directly supplied to the data input D of the 18-bit data registers $R_1$. As a result, the pixel lines $PL_1, PL_2, \ldots, PL_{128}$ are sequentially activated in synchronization with the rising edges of the inverted shift pulse signals $/SP_1, /SP_2, \ldots, /SP_{127}$, respectively. Therefore, first, the 18-bit pixel signal DA is supplied via the pixel line $PL_1$ to only the 18-bit data register $R_1$. Then, the supplying of the 18-bit pixel signal DA via the pixel line $PL_2$ to the 18-bit data register $R_2$ is allowed, so that the 18-bit pixel signal DA is supplied via the pixel line $PL_2$ to the 18-bit data register $R_2$ as well as the 18-bit data register $R_1$. Finally, the supplying of the 18-bit pixel signal DA via the pixel lines $PL_1, PL_2, \ldots, PL_{128}$ to the 18-bit data registers $R_1, R_2, \ldots, R_{128}$ is allowed, so that the 18-bit pixel signal DA is supplied to all of the 18-bit data registers $R_1, R_2, \ldots, R_{128}$.

Note that each of the 18-bit data registers $R_1, R_2, \ldots, R_{128}$ generate 6-bit video signals such as a 6-bit red signal such as $D_1$, a 6-bit green signal such as $D_2$ and a 6-bit blue signal such as $D_3$.

Figure 11:
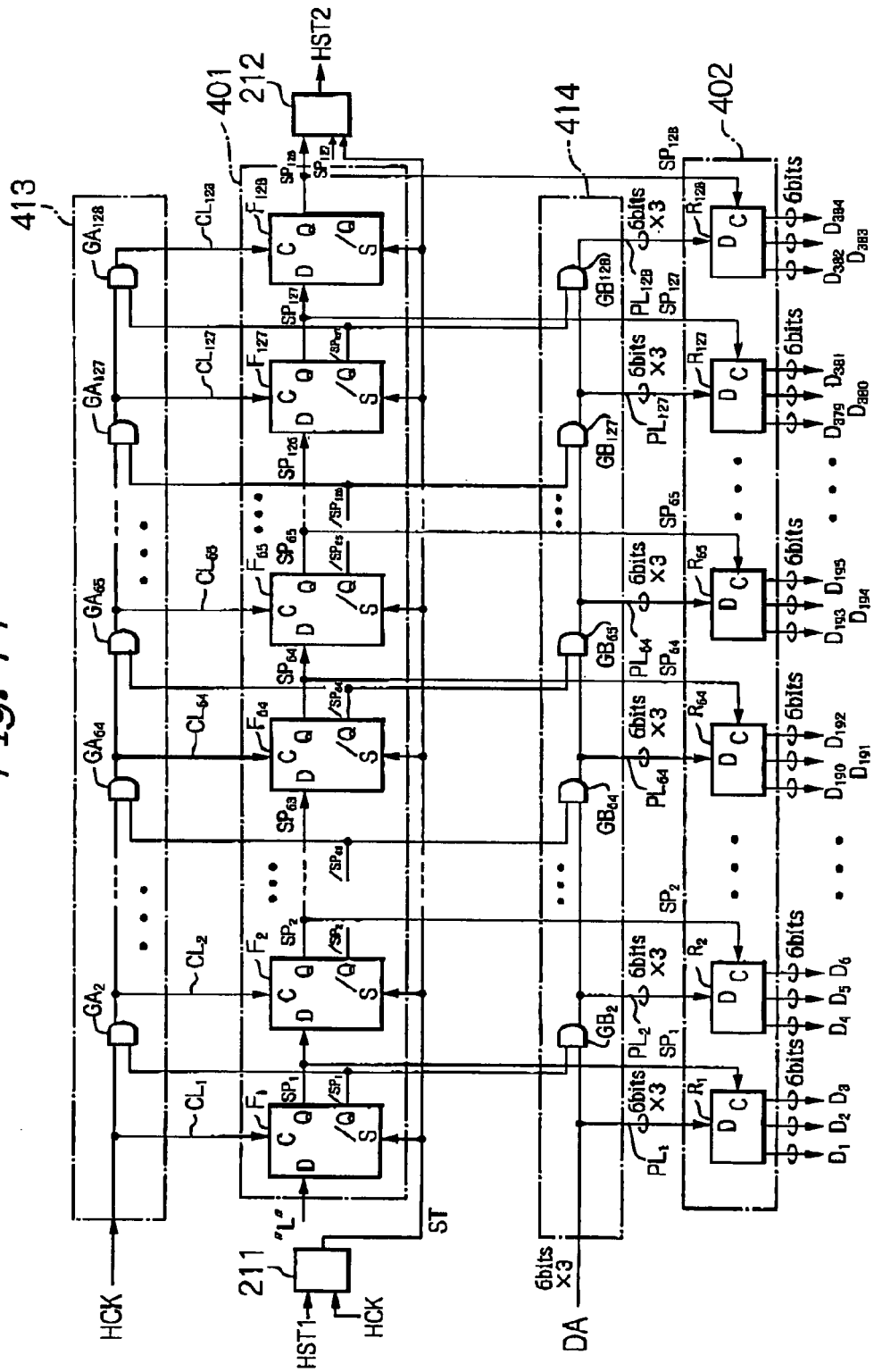
FIG. 11 is a detailed circuit diagram of the horizontal shift register, the data register, the clock gate circuit and the pixel gate circuit of FIG. 10.
Figure 12:
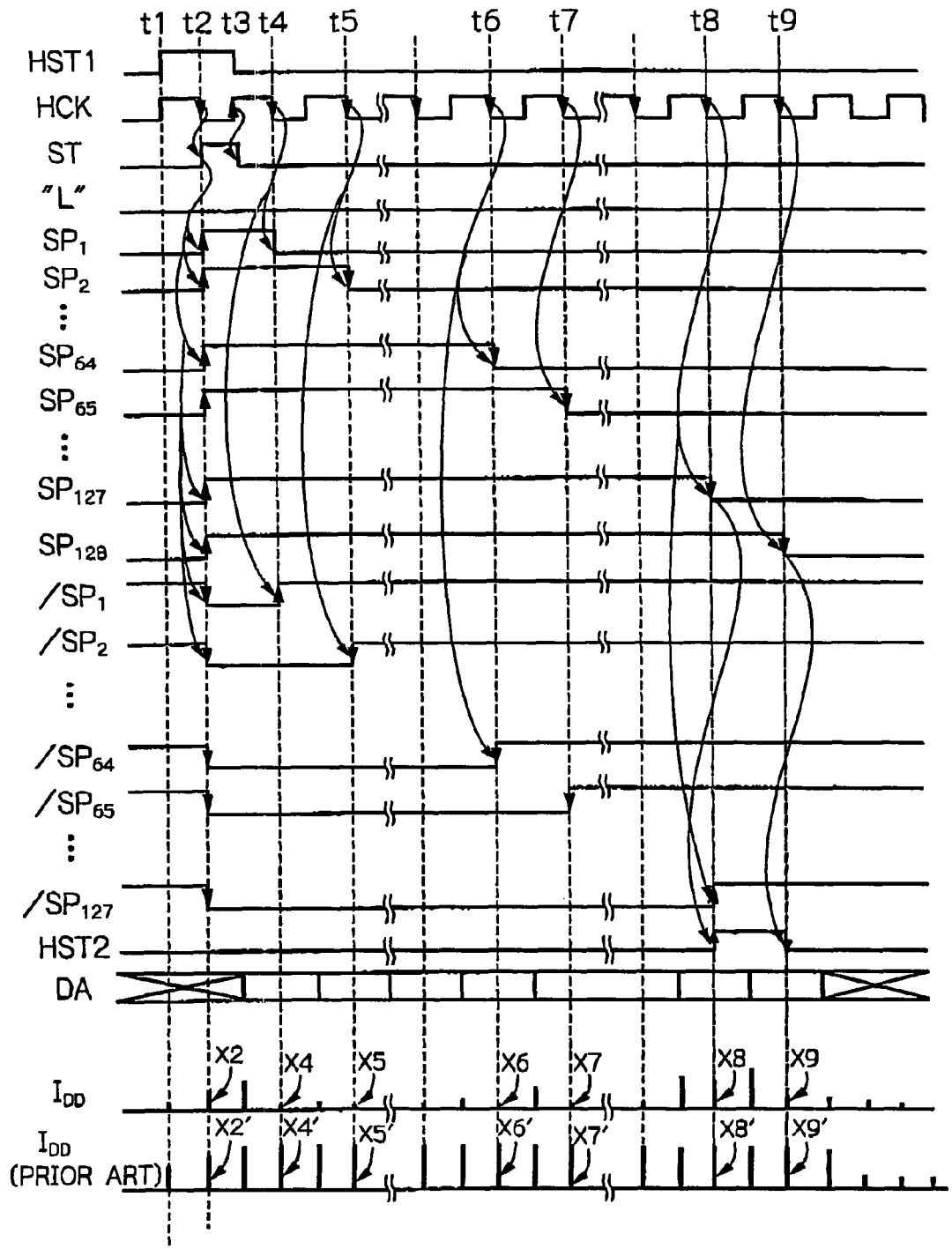
FIG. 12 is a timing diagram for explaining the operation of the data line driver of FIG. 11.

The operation of the circuit of FIG. 11 is explained next with reference to FIG. 12.

First, at time t1, the horizontal start signal HST1 rises. Then, at time t2, the horizontal clock signal HCK falls, so that the set signal ST of the set signal generating circuit 211 rises. As a result, all the set-type D flip-flops $F_1, F_2, \ldots, F_{64}, F_{65}, \ldots, F_{127}, F_{128}$ are set, i.e., all the shift pulse signals $SP_1, SP_2, \ldots, SP_{64}, SP_{65}, \ldots, SP_{127}, SP_{128}$ rise, and the inverted shift pulse signals $/SP_1, /SP_2, \ldots, /SP_{64}, /SP_{65}, \ldots, /SP_{127}$ fall. Note that the set signal ST falls at time t3 when the horizontal clock signal HCK rises.

Thus, at time t2, in the clock gate circuit 413, the AND circuits $GA_2, \ldots, GA_{64}, GA_{65}, \ldots, GA_{128}$ are in a stop mode for stopping the horizontal clock signal HCK by the leading edges of the inverted shift pulse signals $/SP_1, /SP_2, \ldots, /SP_{64}, /SP_{65}, \ldots, /SP_{127}$. Also, in the pixel gate circuit 414, the AND circuits $GB_2, \ldots, GB_{64}, GB_{65}, \ldots, GB_{128}$ are in a stop mode for stopping the pixel signal DA by the leading edges of the inverted shift pulse signals $/SP_1, /SP_2, \ldots, /SP_{64}, /SP_{65}, \ldots, /SP_{127}$. Therefore, the horizontal clock signal HCK is supplied via the clock signal line $CL_1$ to only the set-type D flip-flop $F_1$, and the pixel signal DA is supplied via the pixel line $PL_1$ to only the data register $R_1$. In this case, the operating current $I_{DD}$ as indicated by X2 as compared with X2' where no clock gate circuits and no pixel gate circuits are provided.

Next, at time t4, the shift pulse signal $SP_1$ of the set-type D flip-flops $F_1$ falls in synchronization with a falling edge of the horizontal clock signal HCK. As a result, the pixel signal DA is latched by the data register $R_1$ in synchronization with a falling edge of the shift pulse signal $SP_1$. Simultaneously, the AND circuits $GA_2$ and $GB_2$ are activated by the inverted shift pulse signal $/SP_1$, so that the clock signal line $CL_2$ and the pixel line $PL_2$ are activated. Thus, the supplying of the horizontal clock signal HCK and the pixel signal DA via the clock signal line $CL_2$ and the pixel line $PL_2$ to the set-type D flip-flop $F_2$ and the data register $R_2$ is allowed. Even in this case, the power consumption would be decreased as indicated by X4 as compared with X4'.

Next, at time t5, the shift pulse signal $SP_2$ of the set-type D flip-flops $F_2$ falls in synchronization with a falling edge of the horizontal clock signal HCK. As a result, the pixel signal DA is latched by the data register $R_2$ in synchronization with a falling edge of the shift pulse signal $SP_2$. Simultaneously, the AND circuits $GA_3$ and $GB_3$ are activated by the inverted shift pulse signal $/SP_2$, so that the clock signal line $CL_3$ and the pixel line $PL_3$ are activated. Thus, the supplying of the horizontal clock signal HCK and the pixel signal DA via the clock signal line $CL_3$ and the pixel line $PL_3$ to the set-type D flip-flop $F_3$ and the data register $R_3$ is allowed. Even in this case, the power consumption would be decreased as indicated by X5 as compared with X5'.

Next, at time t6, the shift pulse signal $SP_{64}$ of the set-type D flip-flops $F_{64}$ falls in synchronization with a falling edge of the horizontal clock signal HCK. As a result, the pixel signal DA is latched by the data register $R_{64}$ in synchronization with a falling edge of the shift pulse signal $SP_{64}$. Simultaneously, the AND circuits $GA_{65}$ and $GB_{65}$ are activated by the inverted shift pulse signal $/SP_{64}$, so that the clock signal line $CL_{65}$ and the pixel line $PL_{65}$ are activated. Thus, the supplying of the horizontal clock signal HCK and the pixel signal DA via the clock signal lines $CL_1, CL_2, \ldots, CL_{65}$ and the pixel lines $PL_1, PL_2, \ldots, PL_{65}$ to the set-type D flip-flops $F_1, F_2, \ldots, F_{65}$ and the data registers $R_1, R_2, \ldots, R_{65}$ is allowed. Even in this case, the power consumption would be decreased as indicated by X6 as compared with X6'.

Next, at time t7, the shift pulse signal $SP_{65}$ of the set-type D flip-flops $F_{65}$ falls in synchronization with a falling edge of the horizontal clock signal HCK. As a result, the pixel signal DA is latched by the data register $R_{65}$ in synchronization with a falling edge of the shift pulse signal $SP_{65}$. Simultaneously, the AND circuits $GA_{66}$, and $GB_{66}$ are activated by the inverted shift pulse signal $/SP_{65}$, so that the clock signal line $CL_{66}$ and the pixel line $PL_{66}$ are activated. Thus, the supplying of the horizontal clock signal HCK and the pixel signal DA via the clock signal lines $CL_1, CL_2, \ldots, CL_{66}$ and the pixel lines $PL_1, PL_2, \ldots, PL_{66}$ to the set-type D flip-flops $F_1, F_2, \ldots, F_{66}$ and the data registers $R_1, R_2, \ldots, R_{66}$ is allowed. Even in this case, the power consumption would be decreased as indicated by X7 as compared with X7'.

Next, at time t8, the shift pulse signal $SP_{127}$ of the set-type D flip-flops $F_{127}$ falls in synchronization with a falling edge of the horizontal clock signal HCK. As a result, the pixel signal DA is latched by the data register $R_{127}$ in synchronization with a falling edge of the shift pulse signal $SP_{127}$. Thus, the supplying of the horizontal clock signal HCK and the pixel signal DA via the clock signal lines $CL_1, CL_2, \ldots, CL_{64}, CL_{65}, \ldots, CL_{127}, CL_{128}$ and the pixel lines $PL_1, PL_2, \ldots, PL_{64}, PL_{65}, \ldots, PL_{127}, PL_{128}$, to the set-type D flip-flops $F_1, F_2, \ldots, F_{64}, F_{65}, \ldots, F_{127}, F_{128}$ and the data registers $R_1, R_2, \ldots, R_{64}, R_{65}, \ldots, R_{127}, R_{128}$, is allowed. Even in this case, the power consumption would be decreased as indicated by X8 as compared with X8'.

Next, at time t9, the shift pulse signal $SP_{128}$ of the set-type D flip-flops $F_{128}$ falls in synchronization with a falling edge of the horizontal clock signal HCK. As a result, the pixel signal DA is latched by the data register $R_{128}$ in synchronization with a falling edge of the shift pulse signal $SP_{128}$. Even in this case, the power consumption would be decreased as indicated by X9 as compared with X9'.

Thus, from time t2 to time t9, the number of activated AND circuits in the clock gate circuit 413 and the number of activated AND circuits in the pixel gate circuit 414 are both sequentially increased by the trailing edges of the inverted shift pulse signals $/SP_1, /SP_2, \ldots, SP_{64}, SP_{65}, \ldots, SP_{127}$, so that the capacitance of the clock signal lines and the capacitance of the pixel lines are substantially increased step by step.

Finally, the start signal generating circuit 212 generates a horizontal start signal HST2 for the next data line driver 2-2 (see: FIG. 1) in response to the falling edges of the shift pulse signals $SP_{127}$ and $SP_{128}$.

Thus, in the third embodiment as illustrated in FIGS. 10 and 11, the supplying of the horizontal clock signal HCK to the clock signal lines $CL_2, \ldots, CL_{64}, CL_{65}, \ldots, CL_{127}, CL_{128}$ and the supplying of the pixel signal DA to the pixel lines $PL_2, \ldots, PL_{64}, PL_{65}, \ldots, PL_{127}, PL_{128}$ are prohibited and allowed in accordance with the inverted shift pulse signals $/SP_1, /SP_2, \ldots, /SP_{127}$. As a result, the load of the horizontal clock signal HCK and the load of the pixel signal DA can be decreased without creating the problems of the above-described first, second and third prior art semiconductor integrated circuit devices. Therefore, even when the horizontal clock signal HCK and the pixel signal DA are at a higher speed, the operating current $I_{DD}$ can be decreased, so that the power consumption can be decreased and the electromagnetic interference (EMI) can be decreased. Further, since the AND circuits are cascaded within each of the clock gate circuits 413 and the pixel gate circuits 414, the penetration currents can be dispersed by the operation delay times of the cascaded AND circuits.

In the above-described third embodiment, each AND circuit such as $GA_2$ and $GB_2$ is provided for one stage such as the set-type D flip-flop $F_2$ and the data register $R_2$; however, each AND circuit can be provided for every two or more stages.

Figure 13:
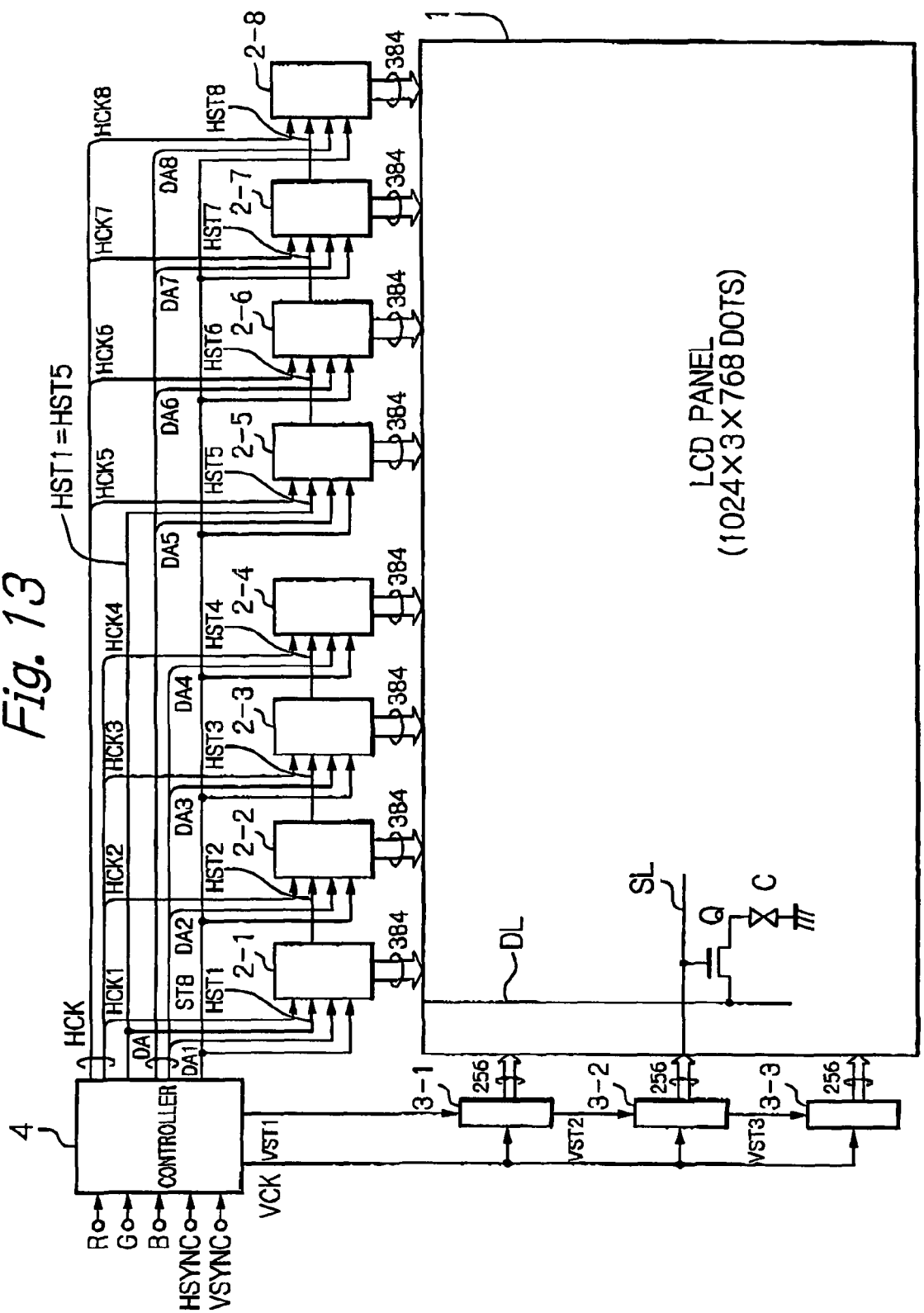
FIG. 13 is a block diagram illustrating an LCD apparatus to which the semiconductor integrated circuit devices of FIGS. 3, 7 and 10 are applied.

The semiconductor integrated circuit device according to the present invention is applied to each of the data line drivers 2-1, 2-2, ..., 2-8 of FIG. 1. However, the semiconductor integrated circuit device according to the present invention can be applied to each data line driver of an LCD apparatus as illustrated in FIG. 13. In FIG. 13, the data line drivers 2-1, 2-2, 2-3 and 2-4 form a first group, and the data line drivers 2-5, 2-6, 2-7 and 2-8 form a second group. The first and second groups receive the same horizontal start signal HST (=HST1=HST5); however, the data line drivers 2-1, 2-2, ..., 2-8 receive different horizontal clock signals HST1, HST2, ..., HST8 and different pixel signals DA1, DA2, ..., DA8. For example, when the data line drivers 2-1 and 2-5 are operated by receiving the horizontal clock signals HST1 and HST5 and the pixel signals DA1 and DA5 while horizontal start signal HST is transferring therethrough, the other data line drivers 2-2, 2-3, 2-4, 2-6, 2-7 and 2-8 are not supplied with the horizontal clock signals and the pixel signals. Thus, the power consumption and the electromagnetic interference (EMI) can further be decreased.

Note that the present invention can be applied to each data line driver of other plane type display apparatuses such as a plasma display apparatus, or an organic or inorganic electroluminescence (EL) display apparatus. Also, the present invention can be applied to other apparatuses including a shift register formed by cascaded flip-flops for passing a start signal.

The invention claimed is:

1. A semiconductor integrated circuit device comprising:
a shift register including a plurality of cascaded flip-flops adapted to generate shift pulse signals in response to a start signal; and
a logic circuit adapted to receive a pulse signal at its input end and supply said pulse signal from its plurality of output ends to said flip-flops, said pulse signal at each of the plurality of output ends being allowed and prohibited by a corresponding one of said shift pulse signals,
wherein said logic circuit comprises a plurality of cascaded logic gates whose output ends serve as the plurality of output ends of said logic circuit, each of said logic gates performing a logic operation upon said pulse signal and a predetermined one of said shift pulse signals to allow and prohibit said pulse signal at a corresponding one of the plurality of output ends of said logic circuit,
wherein leading edges of said shift pulse signals coincide with each other, and trailing edges of said shift pulse signals are shifted from each other, such that said pulse signal at the plurality of output ends of said logic circuit are sequentially allowed or prohibited, and
wherein said logic circuit comprises:
a pre-stage logic circuit being adapted to receive said pulse signal at its input end and supply said pulse signal from its plurality of output ends to a pre-stage half of said flip-flops, said pulse signal at each of the plurality of output ends of said pre-stage logic circuit being allowed and prohibited by a corresponding one of said shift pulse signals of the pre-stage half of said flip-flops,
wherein, after said pulse signal at each of the plurality of output ends of said pre-stage logic circuit is allowed by the leading edges of said shift pulse signals of the pre-stage half of said flip-flops, said pulse signal is prohibited sequentially from a final one of the plurality of output ends of said pre-stage logic circuit to a first one of the plurality of output ends of said pre-stage logic circuit by the trailing edges of said shift pulse signals of the pre-stage half of said flip-flops; and
a post-stage logic circuit being adapted to receive said pulse signal at its input end and supply said pulse signal from its plurality of output ends to a post-stage half of said flip-flops, said pulse signal at each of the plurality of output ends of said post-stage logic circuit being allowed and prohibited by a corresponding one of said shift pulse signals of the post-stage half of said flip-flops,
wherein, after said pulse signal at each of the plurality of output ends of said post-stage logic circuit is allowed by the leading edges of said shift pulse signals of the post-stage half of said flip-flops, said pulse signal is prohibited sequentially from a final one of the plurality of output ends of said post-stage logic circuit to a first one of the plurality of output ends of said post-stage logic circuit by the trailing edges of said shift pulse signals of the post-stage half of said flip-flops.

2. The semiconductor integrated circuit device as set forth in claim 1, wherein said flip-flops comprise set-type flip-flops,
said semiconductor integrated circuit device further comprising:
a set signal generating circuit adapted to receive said start signal to generate a set signal for setting said set-type flip-flops; and
a start signal generating circuit adapted to receive some of said shift pulse signals and said set signal to generate a start signal for a next stage semiconductor integrated circuit device.

3. The semiconductor integrated circuit device as set forth in claim 1, wherein said pulse signal comprises a clock signal supplied to said flip-flops.

4. The semiconductor integrated circuit device as set forth in claim 1, wherein said pulse signal comprises a data signal, said semiconductor integrated circuit device further comprising a data register adapted to latch said data signal in synchronization with said shift pulse signals.

5. The semiconductor integrated circuit device as set forth in claim 1, wherein said pulse signal comprises a clock signal, said semiconductor integrated circuit device comprising:
another logic circuit adapted to receive a data signal at its input end and supply said pulse signal from its plurality of output ends to said flip-flops, said data signal at each of the plurality of output ends being allowed and prohibited by a corresponding one of said shift pulse signals; and
a data register adapted to latch said data signal in synchronization with said shift pulse signals.

6. The semiconductor integrated circuit device as set forth in claim 1, serving as a data line driver of a plane-type display apparatus.

7. A semiconductor integrated circuit device serving as a data line driver of a plane-type display apparatus, the semiconductor integrated circuit device comprising:
a shift register including a plurality of cascaded flip-flops adapted to generate shift pulse signals in response to a start signal;
a data register adapted to latch a data signal in synchronization with said shift pulse signals;

a first logic circuit adapted to receive a clock signal at its first input end and supply said clock signal from its plurality of first output ends to said flip-flops, said first logic circuit including a plurality of cascaded first logic gates each performing a logic operation upon said clock signal and a predetermined one of said shift pulse signals such that said clock signal at each of the plurality of first output ends being allowed and prohibited by a corresponding one of said shift pulse signals; and a second logic circuit adapted to receive said data signal at its second input end and supply said data signal from its plurality of second output ends to said data register, said second logic circuit including a plurality of cascaded second logic gates each performing a logic operation upon said data signal and a predetermined one of said shift pulse signals such that said data signal at each of the plurality of second output ends being allowed and prohibited by a corresponding one of said shift pulse signals, wherein leading edges of said shift pulse signals coincide with each other, and trailing edges of said shift pulse signals are shifted from each other, such that said clock signal at the plurality of output ends of said first logic circuit are sequentially allowed or prohibited, and wherein said first logic circuit comprises:

a pre-stage logic circuit being adapted to receive said clock signal at its input end and supply said pulse signal from its plurality of output ends to a pre-stage half of said flip-flops, said pulse signal at each of the plurality of output ends of said pre-stage logic circuit being allowed and prohibited by a corresponding one of said shift pulse signals of the pre-stage half of said flip-flops, wherein, after said pulse signal at each of the plurality of output ends of said pre-stage logic circuit is allowed by the leading edges of said shift pulse signals of the pre-stage half of said flip-flops, said pulse signal is prohibited sequentially from a final one of the plurality of output ends of said pre-stage logic circuit to a first one of the plurality of output ends of said pre-stage logic circuit by the trailing edges of said shift pulse signals of the pre-stage half of said flip-flops; and a post-stage logic circuit being adapted to receive said clock signal at its input end and supply said pulse signal from its plurality of output ends to a post-stage half of said flip-flops, said clock signal at each of the plurality of output ends of said post-stage logic circuit being allowed and prohibited by a corresponding one of said shift pulse signals of the post-stage half of said flip-flops, wherein, after said clock signal at each of the plurality of output ends of said post-stage logic circuit is allowed by the leading edges of said shift pulse signals of the post-stage half of said flip-flops, said clock signal is prohibited sequentially from a final one of the plurality of output ends of said post-stage logic circuit to a first one of the plurality of output ends of said post-stage logic circuit by the trailing edges of said shift pulse signals of the post-stage half of said flip-flops.

8. The shift register as set forth in the semiconductor integrated circuit device of claim 7, wherein the plurality of cascaded flip-flops are each adapted to latch a 1-bit signal and output said 1-bit signal, wherein, after the 1-bit signal of one of said flip-flops is shifted by receiving the clock signal to its post-stage one of said flip-flops, supplying of said clock signal to the one of said flip-flops is prohibited.

9. The shift register as set forth in claim 7, wherein the plurality of cascaded flip-flops are each adapted to latch a 1-bit signal and output said 1-bit signal, wherein immediately before the 1-bit signal of one of said flip-flops is shifted by receiving the clock signal to its post-stage one of said flip-flops, supplying of said clock signal to the one of said flip-flops is allowed.

* * * * *